US008392789B2

(12) United States Patent
Biscondi et al.

(10) Patent No.: US 8,392,789 B2
(45) Date of Patent: Mar. 5, 2013

(54) METHOD AND SYSTEM FOR DECODING LOW DENSITY PARITY CHECK CODES

(75) Inventors: Eric Biscondi, Opio (FR); David Hoyle, Austin, TX (US); Tod David Wolf, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 771 days.

(21) Appl. No.: 12/510,899

(22) Filed: Jul. 28, 2009

(65) Prior Publication Data

US 2011/0029756 A1      Feb. 3, 2011

(51) Int. Cl.
H03M 13/00     (2006.01)
(52) U.S. Cl. ........ 714/755; 714/786; 714/780; 714/794; 712/22; 375/262; 375/341
(58) Field of Classification Search .................. 714/755, 714/786, 790, 752, 780, 794; 712/22; 375/262, 375/341
See application file for complete search history.

(56) References Cited

U.S. PATENT DOCUMENTS

| | | | |
|---|---|---|---|
| 7,143,333 B2 | 11/2006 | Blankenship et al. | |
| 7,178,080 B2 | 2/2007 | Hocevar | |
| 7,181,676 B2 | 2/2007 | Hocevar | |
| 7,203,897 B2 | 4/2007 | Blankenship et al. | |
| 7,318,186 B2 | 1/2008 | Yokokawa et al. | |
| 2004/0194007 A1 | 9/2004 | Hocevar | |
| 2006/0015802 A1 | 1/2006 | Hocevar | |
| 2006/0136799 A1* | 6/2006 | Choi et al. ................ | 714/752 |
| 2007/0011568 A1 | 1/2007 | Hocevar | |
| 2007/0283215 A1 | 12/2007 | Zhu et al. | |
| 2008/0065956 A1 | 3/2008 | Blankenship et al. | |
| 2008/0126916 A1 | 5/2008 | Chung et al. | |
| 2008/0320374 A1 | 12/2008 | Prabhakar et al. | |
| 2009/0013239 A1 | 1/2009 | Blanksby | |
| 2009/0113174 A1 | 4/2009 | Wolf et al. | |

OTHER PUBLICATIONS

Shokrollahi, Amin, "LDPC Codes: An Introduction", Apr. 3, 2003, Digital Fountain, Inc., Fremont, CA, pp. 1-34.
Sun, Yang, et al., "High Throughput, Parallel, Scalable LDPC Encoder/Decoder Architecture for OFDM Systems", IEEE Dallas Circuits and Systems Workshop, Oct. 2006, pp. 1-4.
Hocevar, Dale E., "A Reduced Complexity Decoder Architecture via Layered Decoding of LDPC Codes", IEEE Workshop on Signal Processing Systems, Oct. 2004, pp. 107-112.
Guilloud, Frederic, et al., "λ-Min Decoding Algorithm of Regular and Irregular LDPC Codes", Proceedings of 3rd International Symposium on Turbo Codes & Related Topics, Sep. 2003, pp. 1-4.
IEEE Std 802.16-2004, IEEE Standard for Local and metropolitan area networks Part 16: Air Interface for Fixed Broadband Wireless Access Systems, Institute of Electrical and Electronics Engineers, Inc., New York, NY, Oct. 1, 2004, pp. 1-895.

* cited by examiner

*Primary Examiner* — Guy Lamarre
(74) *Attorney, Agent, or Firm* — Mirna Abyad; W. James Brady; Frederick J. Telecky, Jr.

(57) ABSTRACT

A method for decoding a codeword in a data stream encoded according to a low density parity check (LDPC) code having an m×j parity check matrix H by initializing variable nodes with soft values based on symbols in the codeword, wherein a graph representation of H includes m check nodes and j variable nodes, and wherein a check node m provides a row value estimate to a variable node j and a variable node j provides a column value estimate to a check node m if H(m,j) contains a 1, computing row value estimates for each check node, wherein amplitudes of only a subset of column value estimates provided to the check node are computed, computing soft values for each variable node based on the computed row value estimates, determining whether the codeword is decoded based on the soft values, and terminating decoding when the codeword is decoded.

5 Claims, 12 Drawing Sheets

| 48 | | 2 | 1 | 0 |
|---|---|---|---|---|
| Lq565 | ∘∘∘ | Lq25 | Lq13 | Lq1 |
| Lq566 | ∘∘∘ | Lq26 | Lq14 | Lq2 |
| Lq567 | ∘∘∘ | Lq27 | Lq15 | Lq3 |
| Lq568 | ∘∘∘ | Lq28 | Lq16 | Lq4 |
| Lq569 | ∘∘∘ | Lq29 | Lq17 | Lq5 |
| Lq570 | ∘∘∘ | Lq30 | Lq18 | Lq6 |
| Lq571 | ∘∘∘ | Lq31 | Lq19 | Lq7 |
| Lq572 | ∘∘∘ | Lq32 | Lq20 | Lq8 |
| Lq573 | ∘∘∘ | Lq33 | Lq21 | Lq9 |
| Lq574 | ∘∘∘ | Lq34 | Lq22 | Lq10 |
| Lq575 | ∘∘∘ | Lq35 | Lq23 | Lq11 |
| Lq576 | ∘∘∘ | Lq36 | Lq24 | Lq12 |
| 0 | ∘∘∘ | 0 | 0 | 0 |
| 0 | ∘∘∘ | 0 | 0 | 0 |
| 0 | ∘∘∘ | 0 | 0 | 0 |
| 0 | ∘∘∘ | 0 | 0 | 0 |

16 BYTES

*FIG. 12*

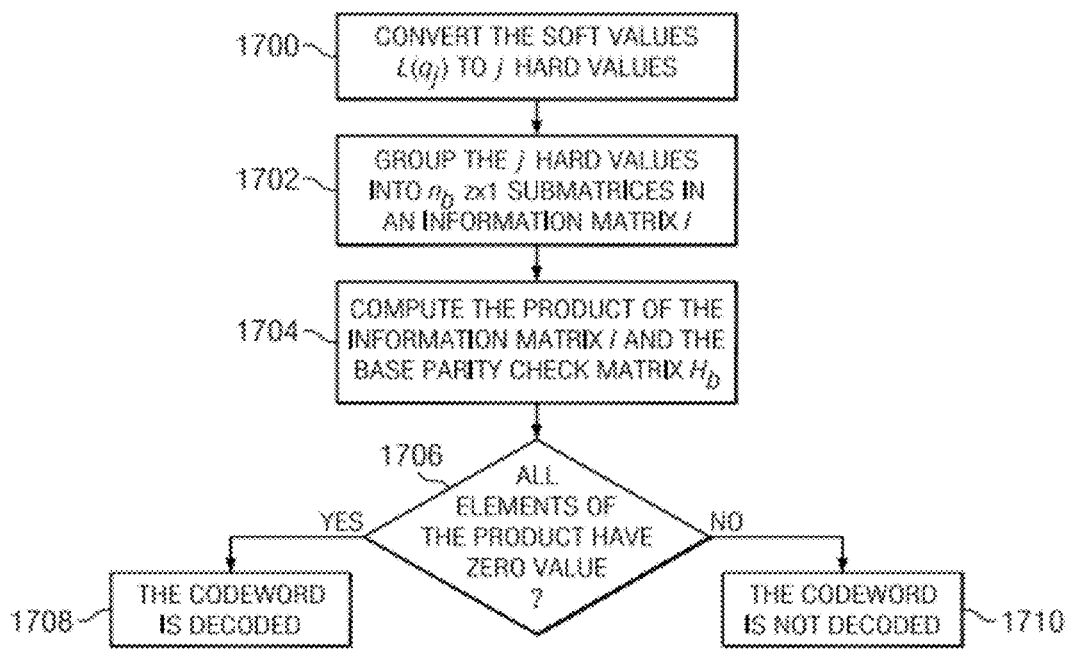

METHOD AND SYSTEM FOR DECODING LOW DENSITY PARITY CHECK CODES

INCORPORATION BY REFERENCE OF COMPUTER PROGRAM LISTING

A text file of a computer program listing of pseudo code with the file name TI-65374PseudoCodeListing.txt of size 58549 bytes and created on Jul. 4, 2009 which was filed concurrently with this patent application is hereby incorporated by reference. This text file is referred to as the pseudo code listing herein.

BACKGROUND OF THE INVENTION

One issue common to many data communications technologies is the corruption of data by noise in a communication channel. Thus, error detection and correction techniques are applied to reduce the data corruption. Many such techniques are implemented using forward error correction, i.e., redundant coding of the data prior to transmission. In general, forward error correction involves inserting data bits into the transmitted data stream that indicate whether an error is present in the received data stream. More complex codes provide the ability to deduce the true transmitted data from a received data stream despite the presence of errors.

Low Density Parity Check (LDPC) codes are error correction codes currently used in many high-speed communication standards, such as DVB-S2 (Digital video broadcasting), WiMAX (IEEE 802.16e standard for microwave communications), 10 GBase-T Ethernet (802.3an) and G.hn/G.9960 (ITU-T Standard for networking over power lines, phone lines and coaxial cable). The LDPC codes used are binary linear block codes with a sparse parity-check matrix H, i.e., the matrix includes a low number of non-zero elements. The parity check matrix H is an m×n matrix, where n is the number of bits in a codeword and m is the number of redundancy bits (i.e., parity bits) of the coding scheme. Further, the location of a 1 in the parity-check matrix H indicates that a bit is involved in a parity check. The code rate R of an LPDC code is a unit of measure based on the number of information bits k and the number of parity bits m that may be contained in a generated codeword. More specifically, a code rate R is a ratio of the number of information bits k in a codeword to the total number of bits n in the codeword, i.e., $$R = k/n$$

For example, a code rate of ½ refers to a codeword in which half of the bits in the codeword are information bits and the other half are parity bits. Further, if the codeword length is 576 bits, the number of information bits k in a codeword generated with a code rate of ½ would be 288 and the number of parity bits m would also be 288.

A Tanner graph, which is a specific type of bipartite graph, may be used to represent a binary LDPC code. The Tanner graph representation has two kinds of nodes, variable nodes which represent the bits of a codeword and check nodes which represent the set of parity-check constraints, i.e., a parity check equation, defining the LDPC code. Each column of the parity check matrix H represents a variable node, and each row represents a check node. A variable node and column of H are referred to interchangeably as are a check node and row of H. Edges in the graph connect variable nodes to check nodes and each pair of nodes is connected by at most one edge. The number of edges in the graph equals the number of ones in the parity check matrix H.

Many of the communication standards specify structured LDPC codes. Instead of specifying a large m×n parity check matrix H, the design of a structured LDPC code starts with a smaller $m_b \times n_b$ base matrix $H_b$, makes z copies of the base matrix $H_b$, and interconnects the copies to form an m×n parity check matrix H, where $m = m_b \times z$ and $n = n_b \times z$. A parity check matrix H is derived from the base parity check matrix $H_b$ by replacing each 1 in the base parity check matrix $H_b$ with a z×z permutation submatrix and each 0 with a z×z submatrix of all zeroes. In essence, each edge in the base parity check matrix $H_b$ is mapped to a vector edge of length z in the parity check matrix H, each variable node of the base parity check matrix $H_b$ is mapped to a vector variable node of length z in the parity check matrix H, and each check node of the base parity check matrix $H_b$ is mapped to a vector check node of length z in the parity check matrix H. Each z×z permutation submatrix is defined as a circular shift of the columns of a z×z identity matrix by some amount.

By using different values of z, i.e., the expansion factor, LDPC codes of rate $k_b/n_b$, where $k_b = n_b - m_b$, can be specified for different information bit sequence sizes $k = z \cdot k_b$ from a single base parity check matrix $H_b$. In addition, a parity check matrix H can be represented in implementations of encoders and decoders by an $m_b \times n_b$ base parity check matrix $H_b$ in which a −1 denotes a z×z all-zero submatrix, a 0 denotes a z×z identity matrix, and any other number denotes a z×z permutation matrix that is a z×z identity matrix circularly shifted by that number. Further, encoding and decoding can be performed based on the smaller $m_b \times n_b$ base parity check matrix $H_b$ and vectors of z bits.

In general, decoding algorithms for LDPC codes are iterative, message passing algorithms in which at each iteration messages representing estimates of bit values of the codeword being decoded are passed from variable nodes to check nodes and from check nodes to variable nodes along the edges of the graph. The messages passed from variable nodes to check nodes are computed based on the observed value of the variable node and some of the messages passed from neighboring check nodes to the variable node. Further, a message sent from a variable node to a check node must not be based on the message sent in the previous round from the check node to the variable node. Similarly, a message sent from a check node to a variable node must not be based on the message sent in the previous round from the variable node to the check node. Messages are exchanged, i.e., the decoding process iterates, until a codeword is detected or a maximum number of iterations is performed.

One message passing algorithm used frequently for LDPC decoding is belief propagation. In belief propagation, the messages transmitted along the edges of the graph represent probabilities, i.e., beliefs. More specifically, a message from a variable node to a check node represents the probability that the variable node, i.e., the bit of the codeword represented by the variable node, has a certain value given the observed value of the variable node and all the values in the messages passed to the variable node from check nodes in the previous iteration. Further, a message from a check node to a variable node represents the probability that the variable node has a certain value given all the messages passed to the check node from other variable nodes in the previous iteration.

In operation, the belief propagation algorithm initially assigns each variable node in the graph a received value that is an estimate of the value of the associated bit as determined by observation of the communications channel. During an iteration of the algorithm, bit probability messages are passed from the variable nodes to the check nodes, updated, and sent back and summed at the variable nodes. The computations in each iteration involve both a row update and a column update of the parity check matrix. The row update involves processing an equation for each edge that enters a check node and permutation of the data after it is read from memory. The column update involves summing the check nodes to form the variable nodes and storing the permuted data in a unique order as defined by the encoder generator matrix. The iterations are repeated until the parity check matrix is satisfied, i.e., all parity check rows are zero, or some other convergence criteria is reached, or until some maximum number of iterations is executed.

Thus, LPDC decoding is computationally complex. In addition, the number of check nodes and variable nodes may be on the order of hundreds or thousands. Further, LDPC decoders may need to process many iterations. Decoding termination algorithms using matrix mathematics may also be required, which involve additional computations and resources. Accordingly, improvements in decoding LDPC codes are desirable.

SUMMARY OF THE INVENTION

In general, the invention relates to a method for decoding a codeword in a data stream encoded according to a low density parity check (LDPC) code having an m×j parity check matrix H. The method includes initializing each of j variable nodes in a graph representation of the parity check matrix H with a soft value $L(q_j)$ based on a jth symbol in the codeword, wherein the graph representation includes m check nodes and j variable nodes and wherein a check node m provides a row value estimate $R_{mj}$ to a variable node j and a variable node j provides a column value estimate $L(q_{mj})$ to a check node m if $H(m,j)$ contains a 1, computing row value estimates $R_{mj}$ for each check node m, wherein amplitudes of only a subset of column value estimates $L(q_{mj})$ provided to the check node m are computed, computing soft values $L(q_j)$ for each variable node j based on the computed row value estimates $R_{mj}$, determining whether the codeword is decoded based on the soft values $L(q_j)$, and terminating decoding when the codeword is decoded.

In general, in one aspect, the invention relates to a computer readable medium that includes executable instructions to perform the above described method when executed by a processor.

In general, in one aspect, the invention relates to a digital system that includes a processor and a memory configured to store software instructions, wherein when executed by the processor, the software instructions cause the digital system to perform the above described method.

BRIEF DESCRIPTION OF THE DRAWINGS

Particular embodiments in accordance with the invention will now be described, by way of example only, and with reference to the accompanying drawings:

FIGS. 10, 11, 12, and 13 show examples of column data storage and row data storage in the memory of an LDPC coprocessor in accordance with one or more embodiments of the invention;

FIG. 16 shows an example of binary matrix multiplication in accordance with one or more embodiments of the invention;

FIG. 17 shows a flow diagram of a method for LDPC decoding termination in accordance with one or more embodiments of the invention;

DETAILED DESCRIPTION OF EMBODIMENTS OF THE INVENTION

Figure 1:
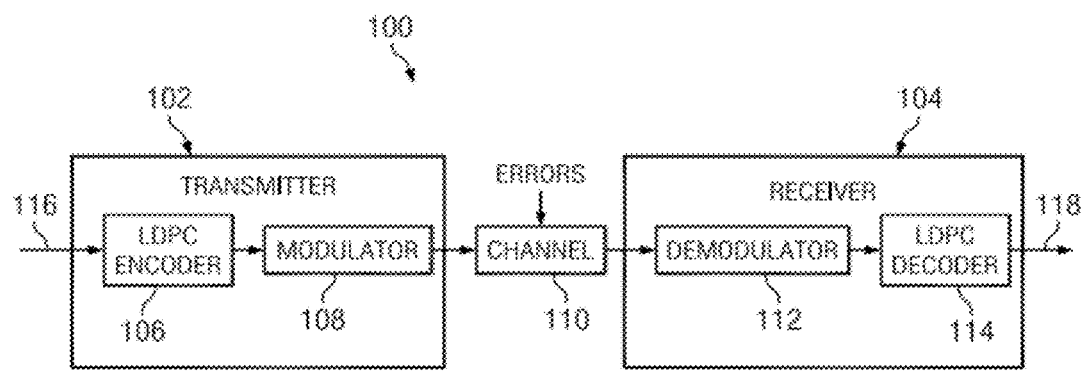
FIG. 1 shows a block diagram of a system for low density parity check (LDPC) encoding and decoding of data transmissions in accordance with one or more embodiments of the invention.

Specific embodiments of the invention will now be described in detail with reference to the accompanying figures. Like elements in the various figures are denoted by like reference numerals for consistency.

Certain terms are used throughout the following description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description. In addition, although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein. Further, although embodiments of the invention are described herein with specific examples based on the IEEE 802.16e standard, embodiments for other standards specifying LDPC coding will be understood by one of ordinary skill in the art. Accordingly, embodiments of the invention should not be considered limited to the IEEE 802.16e standard.

In general, embodiments of the invention provide systems and methods for low density parity check (LDPC) decoding. More specifically, one or more embodiments of the invention provide an approach for LDPC decoding in which the computation of the row update is optimized to reduce the number of computations at each check node. Some embodiments of the invention provide an optimal memory allocation scheme for LDPC data when performing LDPC decoding with single instruction multiple data (SIMD) instructions. Further, an approach for determining when a codeword has been successfully decoded based on a base parity check matrix is provided in some embodiments of the invention.

FIG. 1 shows a block diagram of a system 100 for LDPC encoding and decoding of data transmissions in accordance with one or more embodiments of the invention. More specifically, the system of FIG. 1 includes an LDPC decoder 114 incorporating decoding methods described herein in accordance with one or more embodiments of the invention. As shown in FIG. 1, the system 100 includes a transmitter 102 and a receiver 104 operatively connected by a communications channel 110. The transmitter 102 includes a LDPC encoder 106 and a modulator 108. The transmitter 102 receives an input bit stream 116 that is to be transmitted to the receiver 104 via the communications channel 110. The input bit stream 116 may be generated, for example, by a computer at the same location as the transmitter 102, or by a computer network, e.g., the Internet, that is coupled to transmitter 102. The input bit stream 116 may be a serial stream of binary digits in a format produced by the source of the bit stream.

The LPDC encoder 106 includes functionality to digitally encode the input bit stream 116 for error detection and correction purposes. More specifically, a redundant LDPC code is applied to the bit stream 116 by the LPDC encoder 106 to encode the bit stream 116 into codewords. The codewords output by the LDPC encoder 106 include both information bits (i.e., bits from the bit stream 116) and parity bits that are selected, based on the information bits, so that the application of the codeword to a sparse parity check matrix H specifying the LDPC code equals zero for each parity check row.

As discussed above, an LDPC code is specified by a sparse m×n parity-check matrix H, where n is the number of bits in a codeword and m is the number of redundancy bits (i.e., parity bits) of the coding scheme. In one or more embodiments of the invention, as shown in Eq. (1), the LDPC encoder 106 adds redundancy to the transmitter bit stream by multiplying a number of bits k, i.e., information bits, in the bit stream 116, referred to in the equations below as I, with a sparse matrix G, i.e., a generator matrix, to generate codewords C of length n.

$$I \times G = C \quad (1)$$

Each resulting codeword C includes k information bits from the bit stream 116 and m=n−k parity bits. The generated codewords are then modulated and transmitted over the channel 110. The variables I, G, and C in Eq. (1) are matrices with the following dimensions: I is a k×1 matrix, G is a k×n matrix, and C is an n×1 matrix. The generator matrix G is defined such that the product of G and the transpose of the parity check matrix H is zero.

In one or more embodiments of the invention, the LDPC encoder 106 provides encoding for multiple LDPC codes. These LPDC codes may have different codeword lengths and/or different code rates. Further, in some embodiments of the invention, the number and values of the lengths of the codewords and the number and values of the code rates are limited by the communication standard supported by the LDPC encoder 106. In some embodiments of the invention, the LDPC encoder 106 supports the IEEE 802.16e standard which defines at least nineteen possible codeword lengths ranging from 576 bits to 2304 bits and at least four code rates, ½, ⅔, ¾, and ⅚.

The LDPC encoder 106 provides the encoded bit stream to the modulator 108, which generates a data stream according to the particular modulation technique for the communications protocol. The modulation applied by the modulator 108 may be any appropriate modulation, such as, for example, single carrier modulation, as used in some of the options of IEEE 802.16 or multiple-carrier modulation, as used in OFDM modulation of some IEEE 802.16 modes or as used in Discrete Multitone modulation (DMT) for conventional DSL communications. In one or more embodiments of the invention, the functionality of the LDPC encoder 106 and modulator 108 may be implemented as digital operations executed by a digital signal processor (DSP).

The resulting data stream is provided to the communications channel 110 for transmission to the receiver 104. The communications channel 110 may be any suitable communications channel 110, such as, for example, in context of wireless communications, the particular environment through which the wireless broadband or LAN transmission takes place and in the DSL context, twisted-pair wire. Errors, i.e., noise, may be introduced into the transmitted data stream as the data stream passes through the communications channel 110.

The receiver 104 includes functionality to reverse the processing of the transmitter 102 to recover the input bit stream 116. The receiver 104 includes a demodulator 112 and a LDPC decoder 114. The demodulator 112 demodulates the received data stream in accordance with the modulation performed by the modulator 108 and provides the demodulated data stream to the LDPC decoder 114. The LDPC decoder 114 includes functionality to apply one or more embodiments of the LDPC decoding methods described herein to reverse the encoding that was applied in the transmission of the data stream to recover an output bit stream 118 that corresponds to the input bit stream.

Figure 2:
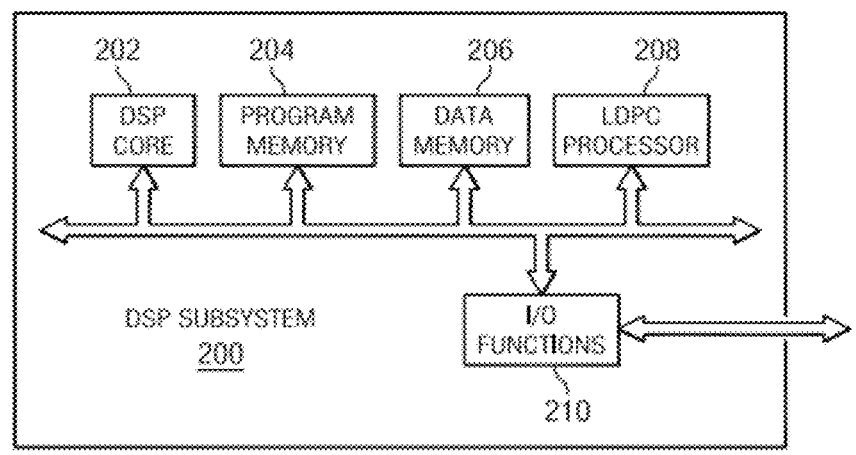
FIG. 2 shows a block diagram of a digital signal processor (DSP) for LDPC decoding in accordance with one or more embodiments of the invention.

Referring again to FIG. 1, in one or more embodiments of the invention, the functionality of the demodulator 112 and the LDPC decoder 114 may be implemented as digital operations executed by a digital signal processor (DSP). FIG. 2 shows a block diagram of a DSP subsystem 200 suitable for LDPC decoding in accordance with one or more embodiments of the invention. The DSP 200 includes a DSP core 202, a program memory 204, a data memory 206, an LDPC coprocessor 208, and input/output (I/O) functions 210 interconnected on a local bus. The DSP core 202 is a full performance DSP, such as, for example, a member of the C64x family of digital signal processors available from Texas Instruments Incorporated. As known in the art, this family of DSPs is of the Very Long Instruction Word (VLIW) type, capable of pipelining eight simple general purpose instructions in parallel.

In one or more embodiments of the invention, the program memory 204 and data memory 206 may be implemented as a single physical memory resource, or within a single memory address space, or both. Further, in some embodiments of the invention, the program memory 204 and data memory 206 may be implemented within DSP core 202. The I/O functions 210 provide input and output operations for the DSP subsystem 200.

The LDPC coprocessor 208 is programmable logic configured for carrying out the operations involved in LDPC decoding. As such, the LDPC coprocessor 208 appears to the DSP core 202 as a traditional coprocessor, which the DSP core 208 accesses by forwarding a higher-level instruction (e.g., DECODE) for execution, along with pointers to the data memory 206 for the data upon which that instruction is to be executed and the destination location for the results of the execution.

In one or more embodiments of the invention, the LDPC coprocessor 208 includes an LDPC program memory, which stores instruction sequences for carrying out LDPC decoding operations and includes a register bank, or another memory resource or data store, for storing data and results of its operations. In addition, the LDPC coprocessor 208 includes logic circuitry for fetching, decoding, and executing instructions and data involved in the LDPC decoding operations, arithmetic and logic circuitry necessary and appropriate for executing its instructions, and memory management and access circuitry for retrieving and storing data from and to data memory 206.

Figure 3:
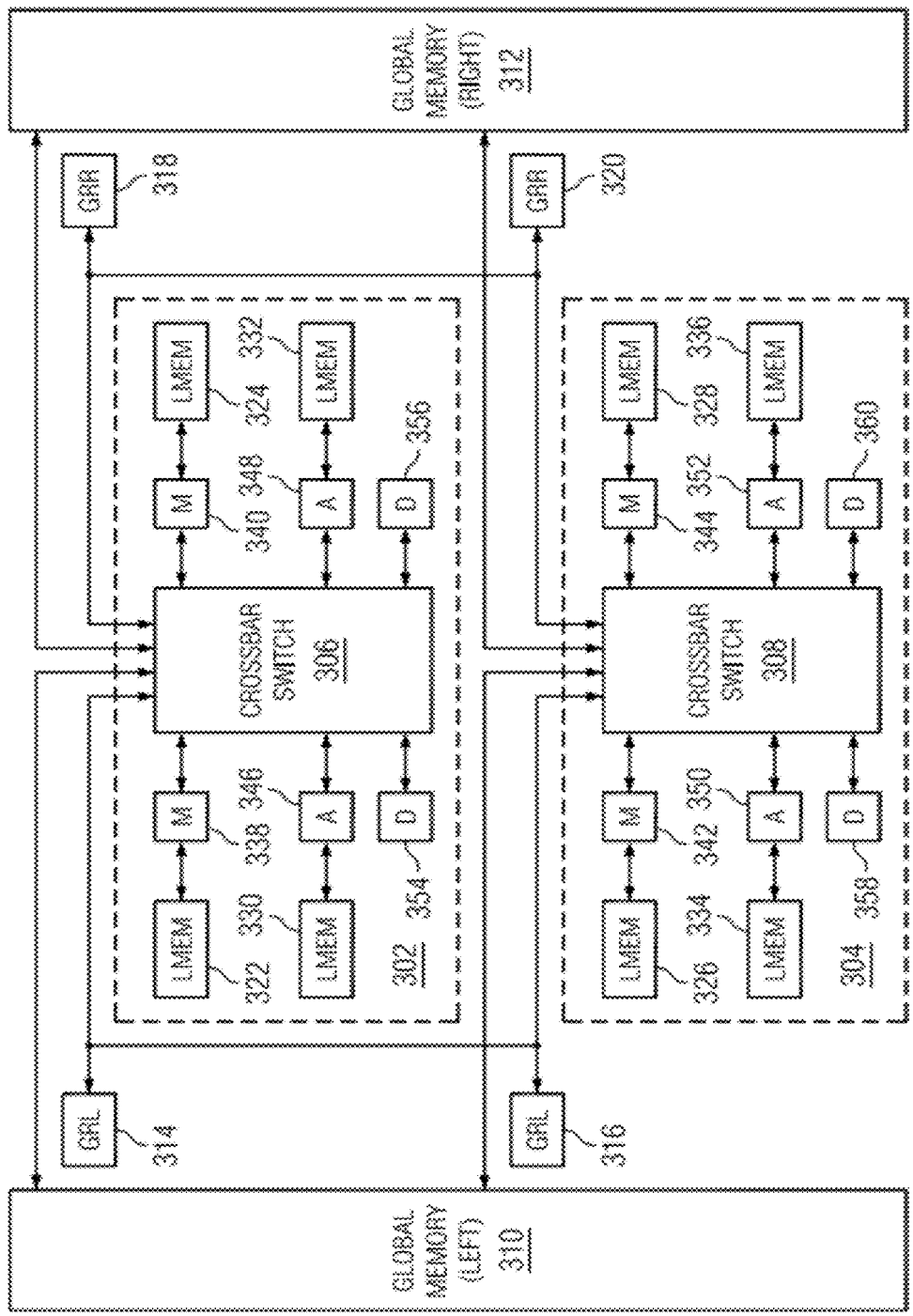
FIG. 3 shows a block diagram of a LDPC coprocessor for LDPC decoding in accordance with one or more embodiments of the invention.

FIG. 3 shows a block diagram of a LDPC coprocessor for LDPC decoding in accordance with one or more embodiments of the invention. As shown in FIG. 3, the architecture of the LDPC coprocessor is a cluster-based architecture having multiple processing clusters 302, 304. The processing clusters 302, 304 are coupled for communication with one another and with memory resources such as global memories 310, 312. While only two clusters are shown in FIG. 3 for simplicity of explanation, embodiments of the LDPC coprocessor may include four or more such clusters. Each cluster 302, 304 is connected to a global memory (left) 310 and to a global memory (right) 312, and can access each of those memory resources to load and store data. The global memories 310, 312 may be part of the LDPC coprocessor as shown in FIG. 3 or may be in external data memory (e.g., the data memory 206 of FIG. 2).

Referring to cluster 302 by way of example, a cluster 302 includes six sub-clusters 338, 340, 346, 348, 354, 356. Each sub-cluster 338, 340, 346, 348, 354, 356 is constructed to execute certain generalized arithmetic or logic instructions in common with the other sub-clusters 338, 340, 346, 348, 354, 356, and is also constructed to perform certain instructions with particular efficiency. For example, sub-cluster M 338 and sub-cluster M 340 are multiplying units, and as such include multiplier circuitry; sub-cluster A 346 and sub-cluster A 348 are arithmetic units, with particular efficiencies for at least some arithmetic and logic instructions; and sub-cluster D 354 and sub-cluster D 356 are data units, constructed to especially be efficient in data load and store operations relative to memory resources outside of cluster 302.

Each sub-cluster 338, 340, 346, 348, 354, 356 includes multiple execution units. For example, sub-cluster 338 includes a main execution, a secondary execution unit, and a sub-cluster register file coupled to the execution units. The other sub-clusters 340, 346, 348, 354, 356 are similarly constructed with perhaps circuitry differences according to the function (multiplier, arithmetic, data) of the sub-cluster. Each sub-cluster 338, 340, 346, 348, 354, 356 is capable of executing two instructions simultaneously in which both instructions have access to the sub-cluster register file of the sub-cluster. As a result, the clusters 302, 304 are each capable of executing twelve instructions simultaneously, assuming no memory or other resource conflicts. In one or more embodiments of the invention, a sub-cluster register file includes thirty-two 64-bit registers that can also be accessed as register pairs for a total of sixteen 128-bit registers.

Cluster 302 also includes local memory resources (LMEM) 322, 324, 330, 332 bi-directionally coupled to some of the sub-clusters. More specifically, local memory resource 322 bi-directionally coupled to sub-cluster 338, local memory resource 324 is bi-directionally coupled to sub-cluster 340, local memory resource 330 is bi-directionally coupled to sub-cluster 346, and local memory resource 332 is bi-directionally coupled to sub-cluster 348. Each sub-cluster 338, 340, 346, 348 can write to and read from the local memory resource to which it is coupled very rapidly, for example within a single machine cycle making the local memory resources useful for storage of intermediate results, such as row and column update values in LDPC decoding. In one or more embodiments of the invention, the size of a local memory resource 322, 324, 330, 332 is 512 addresses×16 bytes (i.e., 8192 bytes) and is physically implemented with sixteen separate individually addressable memory banks in which each memory bank is 512×1 byte.

Each sub-cluster 338, 340, 346, 348, 354, 356 in cluster 302 is bi-directionally connected to a crossbar switch 306. The crossbar switch 306 manages the communication of data into, out of, and within cluster 302 by coupling individual ones of the sub-clusters 338, 340, 346, 348, 354, 356 to other sub-clusters within cluster 302, or to a memory resource. As discussed above, these memory resources include global memory (left) 310 and global memory (right) 310. Each of the sub-clusters 338, 340, 346, 348, 354, 356 can thus access both global memory (left) 310 and global memory (right) 312 allowing the use of the global memories for communicating data among the clusters 302, 304. In some embodiments of the invention, the sub-clusters 338, 340, 346, 348, 354, 356 are split so that each sub-cluster can access one of the global memories 310, 312 through the crossbar switch 306, but not the other. For example, sub-clusters 338, 346, 354 may be capable of accessing global memory (left) 310 but not global memory (right) 312 and sub-clusters 340, 348, 356 may be capable of accessing global memory (right) 312 but not global memory (left) 310. In one or more embodiments of the invention, the crossbar switch 306 allows all functional units to transfer a 128-bit value to another functional unit in each cycle.

The cluster 302 also includes global register files 314, 318 connected to the crossbar switch 306 and accessible by cluster 304 to provide faster data communication. The global register files 314, 318 include addressable memory locations can be read and written in fewer machine cycles than the global memories 310, 312. For example, two machine cycles may be required to write a data word into a location of a global register file 314, 318, and one machine cycle may be required to read a data word from a location of a global register file 314, 318 while as many as seven machine cycles may be required to read or write a data word in the global memories 310, 312. Accordingly, the global register files 314, 318 provide a rapid path for communication of data from cluster-to-cluster. For example, a sub-cluster in cluster 302 may write data into a location of one of global register files 314, 318 and a sub-cluster in cluster 304 may read the data from that location. In one or more embodiments of the invention, the global register files 314, 318 can have up to four reads and four writes per cycle.

In one or more embodiments of the invention, the LDPC coprocessor of FIG. 3 implements explicit VLIW instructions. Further, in embodiments having four clusters, the twenty-four sub-clusters can execute up to forty-eight instructions per clock cycle. Between the global memories, global register files, and sub-cluster register files, additional instructions are supported. Thus, a four cluster coprocessor can execute up to a total of 132 instructions per clock cycle.

Figure 4:
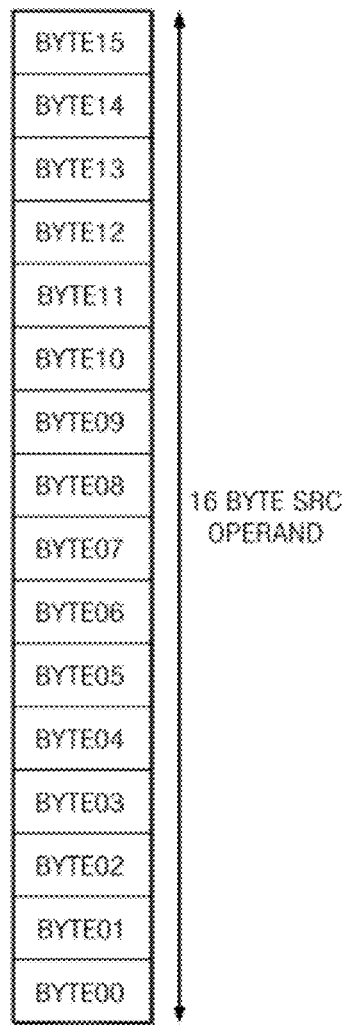
FIG. 4 shows an example of the data width of the LDPC coprocessor in accordance with one or more embodiments of the invention.
Figure 5:
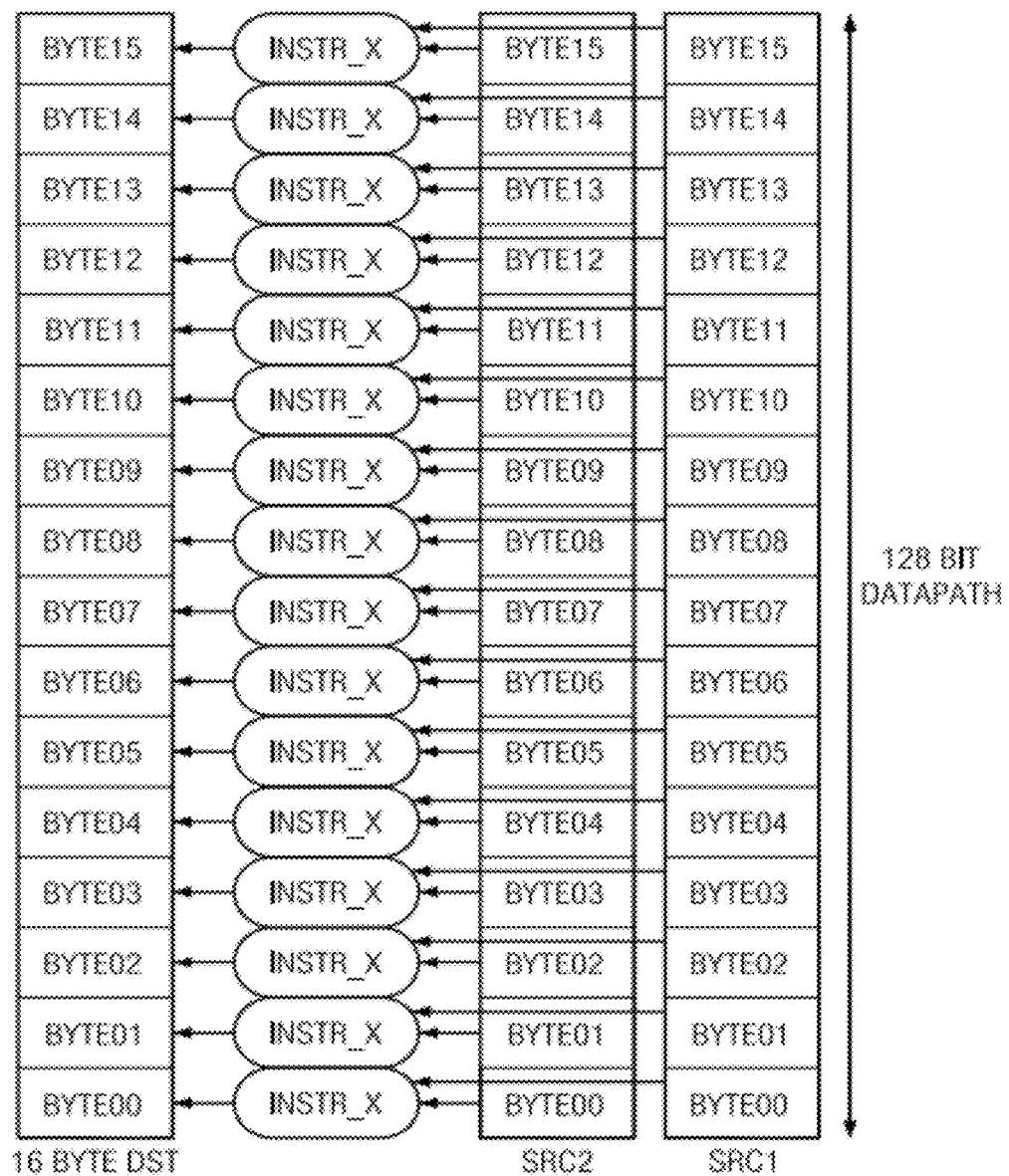
FIG. 5 shows a block diagram of the structure a single instruction multiple data (SIMD) instruction of the LDPC coprocessor in accordance with one or more embodiments of the invention.

As is shown in FIG. 4, the data width, i.e., the width of a data word, for the LDPC coprocessor is 128 bits, i.e., 16 bytes (a quadword). Each sub-cluster implements single instruction multiple data (SIMD) instructions that support this 16 byte functionality. That is, the SIMD instructions are defined to process the 16 individual bytes in a quadword in parallel per clock cycle. This gives the SIMD instructions a 16× advantage as compared with single instruction single data (SISD) instructions. FIG. 5 shows the generic structure of a SIMD instruction. The implemented SIMD instructions include, for example, many of the basic logical or arithmetic instructions such as XOR, AND, ADD, SUB, and COMPARE. In addition, in one or more embodiments of the invention, specific SIMD instructions to support LDPC decoding are implemented. Table 1 lists the SIMD instructions that may be included in the coprocessor instruction set in some embodiments to improve the cycle counts for the row updates performed during LDPC decoding and Table 2 lists the SIMD instructions that may be included in some embodiments to improve the clock cycle counts when testing for convergence.

TABLE 1

| Instruction | # of source operands | Description |
|---|---|---|
| SGNFLIP16B (ABS16B) | 2 | Performs the absolute value on 16 individual bytes. Results are 16 individual bytes and they are saturated. Note: SGNFLIP16B(x, x) = ABS16B(x) |
| SADD16B | 2 | Adds 16 pairs of individual bytes. Results are 16 individual bytes and they are saturated. |
| SSUB16B | 2 | Subtracts 16 pairs of individual bytes. Results are 16 individual bytes and they are saturated. |
| MVCMPLT16B | 2 | Compares 16 individual bytes with a register that has a value of 0. Writes the 16 comparison results to a predication register, i.e., a register used for conditional code. |
| LUWL16B LUWH16B | 2 | Writes 16 individual bytes to 16 different addresses in local memory. The first operand contains the data and the second operand contains the addresses. |
| LURPERML16B LURPERMH16B | 2 | Reads 16 individual bytes from 16 different addresses in the LMEM. The first operand contains the 16 addresses and the second operand contains the permutation order. |
| MVCMPLT16B | 2 | Selects 16 minimums from 16 individual byte pairs from 2 registers. |
| MINST16B | 2 | Performs the following equation on 16 individual byte pairs: $\Psi(x, y) = \min(x, y) + f(x + y) - f(x - y)$ Two configuration registers are required. One is the threshold and the other is the data. See Table 5. |
| PERM16B | 2 | Permutes the order of 16 bytes within 16 bytes. |
| SGNFLIP16B | 2 | Uses the sign of each byte in the second operand to flip the sign of each byte in the first operand. Repeat for all 16 individual bytes. |
| SGNPROD16B | 2 | Multiplies 16 pairs of individual bytes. The 16 results contain the product of the signs (+1 or −1). |

TABLE 2

| Instruction | # of source operands | Description |
|---|---|---|
| SHL1QI | 2 | Performs a left shift on a 128-bit register pair. The first operand is the register pair and the second operand is a 10-bit constant that can range from 1 to 128. |
| SHRU1QI | 2 | Performs a right shift on a 128-bit register pair. The first operand is the register pair and the data is unsigned. The second operand is a 10-bit constant that can range from 1 to 128. |
| STCMPLTZ16B | 2 | Compares X number of individual bytes with 0 and stores X bit results into the lower X bits of a register pair. The first operand is the input data and the second operand is the number of bytes to compare (X). |

Figure 6:
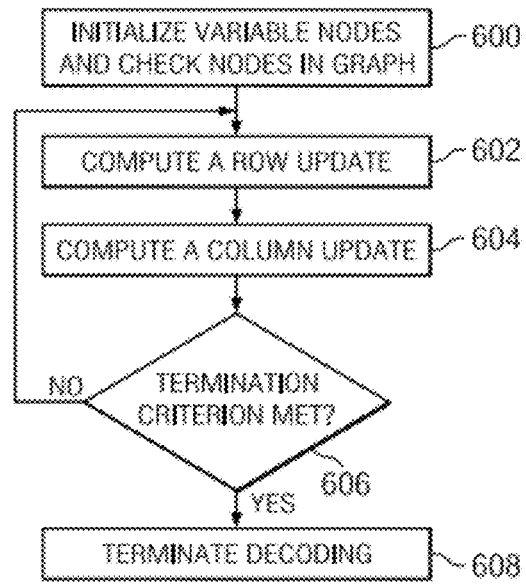
FIG. 6 shows a flow diagram of a method for LDPC decoding in accordance with one or more embodiments of the invention.
Figure 7:
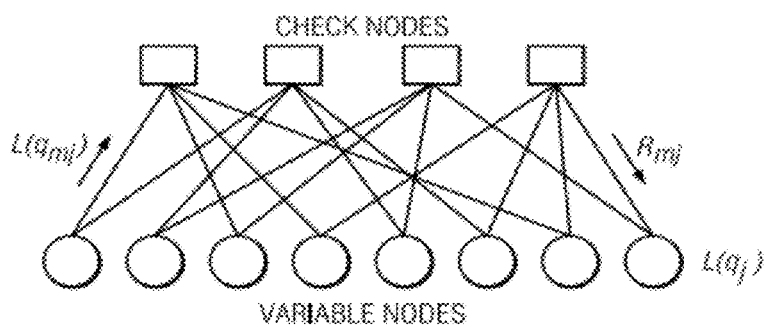
FIG. 7 shows an example Tanner graph in accordance with one or more embodiments of the invention.

FIG. 6 shows a flow graph of a method for LDPC decoding in accordance with one or more embodiments of the invention. In general, the method corrects codewords in a received data stream encoded with an LDPC code using a variation of the belief propagation (BP) algorithm referred to as log decoding. As previously discussed, the BP algorithm is a type of graph based message passing system where the messages represent probabilities. The graph used is called a Tanner graph, an example of which is shown in FIG. 7. The variable nodes (i.e., column nodes) in the graph represent the columns of the m×n parity check matrix H of the LDPC code, the check nodes (i.e., row nodes) represent the rows of the parity check matrix H, and the number of edges is equal to the number of ones in the parity check matrix H. In log decoding, the messages sent between the variable nodes and the check nodes are estimates of the log likelihood ratios (LLRs) of the values of the bits in the codeword being decoded. A message, i.e., LLR estimate, sent from a variable node $L(q_j)$ (j=n) to a check node m is referred to as $L(q_{mj})$ or column value estimate and a message sent from a check node m to a variable node $L(q_j)$ is referred to as $R_{mj}$ or row value estimate.

In some embodiments of the invention, multiple code rates with multiple codeword sizes n are supported by representing the parity check matrix H as an expansion z of an $m_b \times n_b$ base parity check matrix $H_b$. For example, IEEE 802.16e defines nineteen base parity check matrices for expansion factors ranging in increments of four from twenty-four to ninety-six inclusive, each matrix having $n_b$=24 columns and a number of rows based on a code rate. Table 3 shows the dimensions of the base parity check matrices for each code rate in IEEE 802.16e. As an example, Table 4 shows the IEEE 802.16e base parity check matrix for a code rate of ½. As previous mentioned, each number in the matrix defines a z×z submatrix in which a −1 represents a zero matrix, a 0 represents an identity matrix, and all other numbers represent an identity matrix that is circular shifted by that number. In these embodiments, a variable node is a vector variable node of length z and a check node is a vector check node of length z.

TABLE 3

| Code rate | $m_b$ | $n_b$ |
|---|---|---|
| ½ | 12 | 24 |
| ⅔ | 8 | 24 |
| ¾ | 6 | 24 |
| ⅚ | 4 | 24 | used to encode the transmitted codeword are initialized 600. Each of the variable nodes $L(q_j)$ is assigned an initial LLR estimate $L(q_j)$, i.e., a soft value, based on the received codeword as shown in the following equation:

$$L(q_j) = \frac{2r_j}{\sigma^2} \quad (2)$$

where $\sigma^2$ is the variance of the estimated channel error of the communication channel (e.g., channel 110 of FIG. 1), $r_j$ is a symbol in the received codeword, and $L(q_j)$ represents a variable node in the log probability domain, i.e., the LLR for a decoded bit corresponding to column j. In practice, a received codeword is a sequence of j symbols $r_j$ in which each $r_j$ corresponds to a respective bit value in the original codeword. The value of each symbol $r_j$ is a fractional value, for example between −1 and 1, expressed in several bits (e.g., six or seven) that represents the value of the corresponding bit in the original codeword. In effect, Eq. (2) converts each symbol value $r_j$ to a probability that the corresponding bit value is a 0 or 1, this probability represented as an LLR.

The check nodes in the graph are initialized to zero. More specifically, the row value estimates $R_{mj}$ of each check node are initialized to 0. The number of check nodes m is defined as $$m = j - k \quad (3)$$

and the initialization equation is $$R_{mj} = 0 \quad (4)$$

In one or more embodiments of the invention, the parity check matrix H may be any of the parity check matrices defined in IEEE 802.16. The defined parity check matrices correspond to at least nineteen possible codeword lengths ranging from 576 bits to 2304 bits and at least four code rates, ½, ⅔, ¾, and ⅚.

After initialization 600, the method iterates 602, 604, 606 until some termination criterion is met 606, such as, for example, the method converges on a solution, i.e., the codeword is decoded, or a maximum number of iterations is performed. If a termination criterion is met after an iteration, decoding is terminated 608. During each iteration, a row update is computed 602, i.e., bit probability messages $L(q_{mj})$ (LLR estimates), are passed from the variable nodes to the check nodes and updated, and then a column update is computed 604, i.e., the updated bit probabilities $R_{mj}$ are sent back and summed at the variable nodes to compute an updated $L(q_j)$, i.e., a soft value, for each variable node.

TABLE 4

| -1 | 94 | 73 | -1 | -1 | -1 | -1 | -1 | 55 | 83 | -1 | -1 | 7  | 0  | -1 | -1 | -1 | -1 | -1 | -1 | -1 | -1 | -1 | -1 |
|----|----|----|----|----|----|----|----|----|----|----|----|----|----|----|----|----|----|----|----|----|----|----|----|
| -1 | 27 | -1 | -1 | -1 | 22 | 79 | 9  | -1 | -1 | -1 | 12 | -1 | 0  | 0  | -1 | -1 | -1 | -1 | -1 | -1 | -1 | -1 | -1 |
| -1 | -1 | -1 | 24 | 22 | 81 | -1 | 33 | -1 | -1 | -1 | 0  | -1 | -1 | 0  | 0  | -1 | -1 | -1 | -1 | -1 | -1 | -1 | -1 |
| 61 | -1 | 47 | -1 | -1 | -1 | -1 | -1 | 65 | 25 | -1 | -1 | -1 | -1 | -1 | 0  | 0  | -1 | -1 | -1 | -1 | -1 | -1 | -1 |
| -1 | -1 | 39 | -1 | -1 | -1 | 84 | -1 | -1 | 41 | 72 | -1 | -1 | -1 | -1 | -1 | 0  | 0  | -1 | -1 | -1 | -1 | -1 | -1 |
| -1 | -1 | -1 | -1 | 46 | 40 | -1 | 82 | -1 | -1 | -1 | 79 | 0  | -1 | -1 | -1 | -1 | 0  | 0  | -1 | -1 | -1 | -1 | -1 |
| -1 | -1 | 95 | 53 | -1 | -1 | -1 | -1 | -1 | 14 | 18 | -1 | -1 | -1 | -1 | -1 | -1 | -1 | 0  | 0  | -1 | -1 | -1 | -1 |
| -1 | 11 | 73 | -1 | -1 | -1 | 2  | -1 | -1 | 47 | -1 | -1 | -1 | -1 | -1 | -1 | -1 | -1 | -1 | 0  | 0  | -1 | -1 | -1 |
| 12 | -1 | -1 | -1 | 83 | 24 | -1 | 43 | -1 | -1 | -1 | 51 | -1 | -1 | -1 | -1 | -1 | -1 | -1 | -1 | 0  | 0  | -1 | -1 |
| -1 | -1 | -1 | -1 | -1 | 94 | -1 | 59 | -1 | -1 | 70 | 72 | -1 | -1 | -1 | -1 | -1 | -1 | -1 | -1 | -1 | 0  | 0  | -1 |
| -1 | -1 | 7  | 65 | -1 | -1 | -1 | -1 | 39 | 49 | -1 | -1 | -1 | -1 | -1 | -1 | -1 | -1 | -1 | -1 | -1 | -1 | 0  | 0  |
| 43 | -1 | -1 | -1 | -1 | 66 | -1 | 41 | -1 | -1 | -1 | 26 | 7  | -1 | -1 | -1 | -1 | -1 | -1 | -1 | -1 | -1 | -1 | 0  |

The method of FIG. 6 is executed to decode each received codeword. First, the nodes in a Tanner graph representing a parity check matrix H for the code rate and codeword length In some embodiments of the invention, computing a row update 602 involves computing Eqs. (5)-(8) below for all m and j where an edge exists between a check node m and a variable node $q_j$. First, the per row (or extrinsic) LLR probabilities $L(q_{mj})$, i.e., column value estimates, for each column j of each row m are computed as per Eq. (5).

$$L(q_{mj}) = L(q_j) - R_m \quad (5)$$

The resulting $L(q_{mj})$ are an estimate for the LLR probability of the input value corresponding to column j, excluding the contribution to the estimate for each row from the row itself. Next, an amplitude $A_{mj}$ and a sign $s_{mj}$ are computed for each of the j variable nodes, for each of the m rows as per equations (6) and (7).

$$A_{mj} = \sum_{\substack{n \in N(m) \\ n \neq j}} \Psi(L(q_{mn})) \quad (6)$$

where $N(m)$ is defined as the set of all columns in a given row m for which codeword bits contribute to the checksum and the function $\Psi$ is defined as $\Psi(\chi) = \log(|\tan h(\chi/2)|)$. The function $\Psi$ is its own negative inverse, i.e., $\Psi(\Psi(x)) = -|x|$, and $\tan h (L/2)$ can be expressed as $(e^2 - 1/e^2 + 1)$ for ease of computation.

$$s_{mj} = \prod_{\substack{n \in N(m) \\ n \neq j}} \text{sgn}(L(q_{mn})) \quad (7)$$

which derives a sign as an odd/even determination of the number of negative probabilities excluding each row's own contribution. Updated estimates of the values $R_{mj}$, i.e., the row value estimates, are then computed as per equation (8).

$$R_{mj} = -s_{mj} \Psi(A_{mj}) \quad (8)$$

The negative sign of the $R_{mj}$, contemplates that the function $\Psi$ is its own negative inverse. The value $R_{mj}$ thus is an estimate of the LLR for a variable node j as derived from the other variable nodes in the mth row of the parity check matrix, except for the variable node j itself.

In one or more embodiments of the invention, the computation of the $\Psi(\chi)$ function in Eq. (6) is optimized as follows. First, note that $\Psi(\chi)$ may be simplified as a "dual-max" approximation as shown in Eq. (9).

$$\Psi(x,y) = \text{sgn}(x)\text{sgn}(y)\min(|x|,|y|) + \log(1+e^{-|x-y|}) - \log(1+e^{-|x-y|}) \quad (9)$$

The two logarithm terms in Eq. (9) may then be rewritten as shown in Eq. (10).

$$\Psi(x,y) = \text{sgn}(x)\text{sgn}(y)\min(|x|,|y|) + f(x+y) - f(x-y) \quad (10)$$

The sgn( ) functions may then removed as shown in Eqs. (11) and (12).

$$\delta(x,y) = \min(|x|,|y|) + f(x+y) - f(x-y) \quad (11)$$

$$\Psi(x,y) = \text{sgn}(x)\text{sgn}(y)\delta(x,y) \quad (12)$$

The two logarithm functions $f(z)$ may then be optimized as illustrated in the example pseudo C code shown in Table 5. In the pseudo C code, z is the sum (or difference) of two of the $L(q_{mn})$ (see Eq. (6)) and the threshold and the value are selected based on what a user wants the logarithm curve to look like. In some embodiments of the invention, the threshold is 1.0 and the value is 0.5. Thus, the $\Psi(x)$ term in Eqs. (6) and (8) is computed as per Eqs. (11) and (12).

TABLE 5

```
double threshold, value;
result = value;
if ((z < −threshold) || (z > threshold)) result = 0;
return (result);
```

In one or more embodiments of the invention, the computation of the row update is optimized to reduce the number of amplitudes computed for each check node m. In a row update as described above, Eq. (6) is executed to compute an amplitude for each edge that connects to a check node m, i.e., for each column value estimate $L(q_{mj})$ received by the check node m. The row update can be simplified to execute Eq. (6) only for a number $\lambda$ of the most significant edges that connect to each check node m. Experiments have shown that column value estimates $L(q_{mj})$ with the smallest absolute values, i.e., the absolute values closest to zero, are the most important for row update computations. Thus, the most significant column value estimates $L(q_{mj})$ for each check node m may be determined by computing the absolute value of each column value estimate $L(q_{mj})$ and sorting the column value estimates $L(q_{mj})$ in ascending order based on the absolute values. Eq. (6) may then be executed for only the top $\lambda$ of the column value estimates $L(q_{mj})$.

The value of $\lambda$ may be chosen as a tradeoff between bit error rate (BER) and complexity of computation. Experiments have shown that $\lambda = 2$ yields good bit error rate (BER) results as compared to executing Eq. (6) for all edges. As is explained in more detail below in reference to FIG. 8, using this optimization with $\lambda = 2$, the $\Psi$ function is executed only one time per check node, thus reducing the complexity of the row update computations. For example, in IEEE 802.16, the maximum allowable number of edges connecting to a single check node is 20. Therefore, without this optimization, the $\Psi$ function would be processed $20(20-1) = 380$ times for a check node having the maximum number of edges as opposed to only once with this optimization. In one or more embodiments of the invention, the optimization to reduce the number of row value estimates $R_{mj}$ computed is combined with the optimization of the $\Psi$ function described above, further reducing the complexity of the row update computations.

Figure 8:
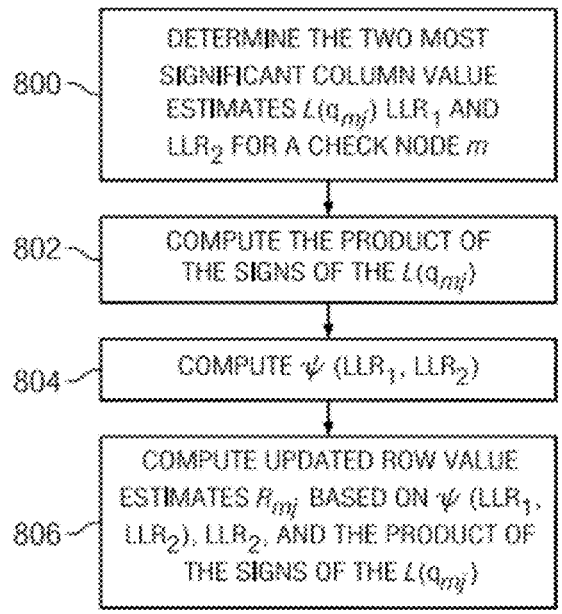
FIG. 8 shows a flow diagram of a method for computing a row update in accordance with one or more embodiments of the invention.

FIG. 8 is a block diagram of a method for computing the updated row value estimates $R_{mj}$ at each check node m using the above optimizations in accordance with one or more embodiments of the invention. This method optimizes the computation of Eqs. (6), (7), and (8) for each check node m. For ease of explanation, the assumption is made that $\lambda = 2$. First, the two most significant column value estimates $L(q_{mj})$, $LLR_1$ and $LLR_2$, are determined for the check node m 800. Thus, $LLR_1$ is the absolute value of the column value estimate having the smallest, i.e., lowest, absolute value and $LLR_2$ is the absolute value of the column value estimate having the next smallest absolute value. Then, the product of the signs, prodsign, of the column value estimates $L(q_{mj})$ is computed (802). Next, $\Psi(LLR_1, LLR_2)$ is computed as per Eq. (10) 804.

Finally, the updated row value estimates $R_{mj}$ for the check node m are computed based on prodsign, $\Psi(LLR_1, LLR_2)$, and $LLR_2$ 806. More specifically, the row value estimate $R_{mj}$ for the variable node j that provided the column value estimate $L(q_{mj})$ corresponding to $LLR_1$ is computed as $$R_{mj} = \text{sgn}(L(q_{mj})) \times \text{prodSign} \times \text{scaleFactor} \times LLR_2$$

and the row value estimates $R_{mj}$ for the variable nodes j that provided the other column value estimates $L(q_{mj})$ are computed as $$R_{mj} = \text{sgn}(L(q_{mj})) \times \text{prodSign} \times \text{scaleFactor} \times \Psi(LLR_1, LLR_2)$$

where scaleFactor is an empirically determined scale factor. Experiments have shown that a scale factor having a value less than 1.0 lowers the bit error rate. In one or more embodiments of the invention, the value of the scale factor is 0.875. Note that in this method, each sign of each of the row value estimates $R_{mj}$ is computed as the product of the sign of the corresponding column value estimate $L(q_{mj})$ and prodsign. In addition, the amplitude of the row value estimate $R_{mj}$ for the variable node j that provided the column value estimate $L(q_{mj})$ corresponding to $LLR_1$ is based solely on $LLR_2$ and the amplitudes of the other row value estimates $R_{mj}$ are based on a function of both $LLR_1$ and $LLR_2$.

One of ordinary skill in the art will understand other embodiments of the above method in which $\lambda>2$. When $\lambda$ is larger than 2, the $\Psi$ function as per Eq. (10) is computed for each pair combination of the $\lambda$ most significant column value estimates $LLR_\lambda$. The updated row value estimates $R_{mj}$ for the check node m may then be computed in a similar fashion as described above. The row value estimate $R_{mj}$ for a variable node j that provided an $LLR_\lambda$ value in a proper subset of the $LLR_\lambda$ values is computed based on the other $LLR_\lambda$ values, i.e., the $LLR_\lambda$ values not provided by the variable node j, and the row value estimates $R_{mj}$ for the other variable nodes j are computed based on all of the $LLR_\lambda$ values. The proper subset of the $LLR_\lambda$ values includes $y<\lambda$ of the $LLR_\lambda$ values having the y smallest absolute values of the $LLR_\lambda$ values. Thus, the amplitude of a row value estimate $R_{mj}$ for a variable node j that provided an $LLR_\lambda$ value in a proper subset of the most significant column values estimates is based solely on $\Psi$ function computations of the pair combinations of the other $LLR_\lambda$ values, and the amplitudes of the row value estimates $R_{mj}$ for the other variable nodes j are computed based on $\Psi$ function computations for all pair combinations of the $LLR_\lambda$ values.

For example, if $\lambda=3$ and $y=2$, $LLR_1$, $LLR_2$, and $LLR_3$ are determined and $\Psi(LLR_1, LLR_2)$, $\Psi(LLR_1, LLR_3)$, and $\Psi(LLR_2, LLR_3)$ are computed. Note that the elements of the proper subset of the $LLR_\lambda$ values are $LLR_1$ and $LLR_2$. Then, the row value estimate $R_{mj}$ for the variable node j that provided the column value estimate $L(q_{mj})$ corresponding to $LLR_1$ is computed as $$R_{mj}=\text{sgn}(L(q_{mj}))\times\text{prodSign}\times\text{scaleFactor}\times\Psi(LLR_2, LLR_3)$$

the row value estimate $R_{mj}$ for the variable node j that provided the column value estimate $L(q_{mj})$ corresponding to $LLR_2$ is computed as $$R_{mj}=\text{sgn}(L(q_{mj}))\times\text{prodSign}\times\text{scaleFactor}\times\Psi(LLR_1, LLR_3)$$

and the row value estimates $R_{mj}$ for the variable nodes j that provided the other column value estimates $L(q_{mj})$ are computed as $$R_{mj}=\text{sgn}(L(q_{mj}))\times\text{prodSign}\times\text{scaleFactor}\times(\Psi(LLR_1, LLR_2)+(\Psi(LLR_1,LLR_3)+(\Psi(LLR_2,LLR_3)))$$

In one or more embodiments of the invention, the computation of a row update as described above is performed on an LDPC coprocessor (e.g., the LDPC coprocessor of FIG. 3) using SIMD instructions added for LDPC decoding such as those listed in Table 1. For example, Eq. (12) above may be computed using the MINST16B instruction. An example of the use of the SIMD instructions for computation of a row update is shown in section 1.1, entitled Row Update Pseudo Code, of the pseudo code listing incorporated by reference. This example assumes the memory layout described below.

Figure 9:
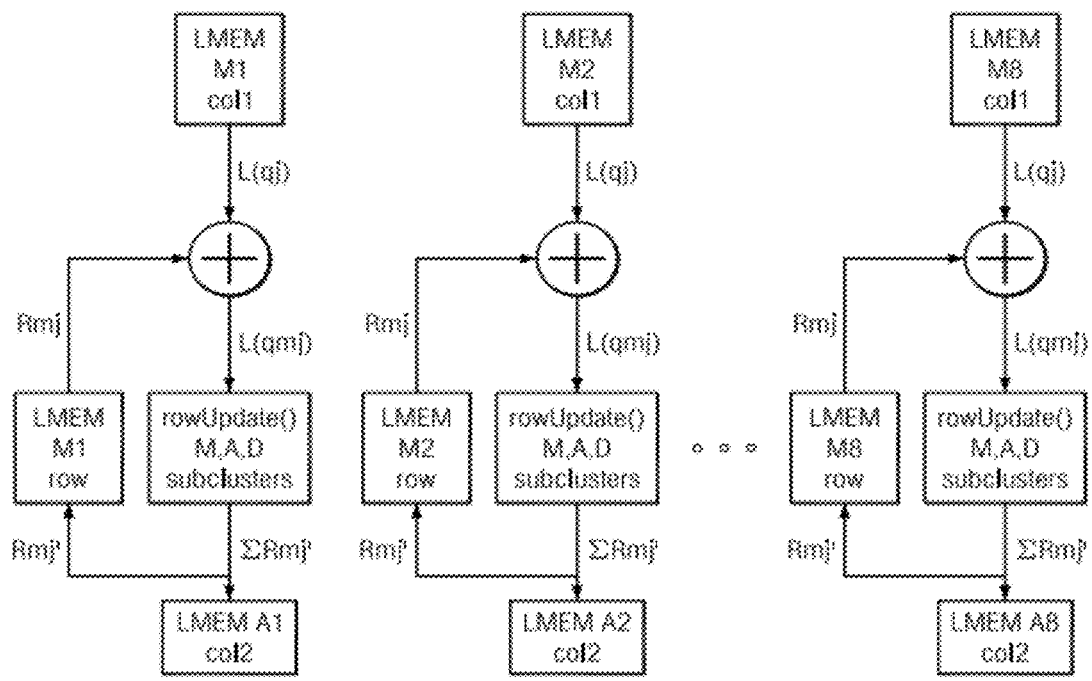
FIG. 9 shows a block diagram of a row update architecture using an LDPC coprocessor in accordance with one or more embodiments of the invention.

The LDPC coprocessor includes four clusters (e.g., cluster 302 of FIG. 3). Each of the four clusters includes two half clusters where each half cluster includes three sub-clusters (e.g., sub-clusters 338, 346 354 in cluster 302 of FIG. 3). Thus, the LDPC coprocessor includes eight half clusters. The row update computations for the m check nodes can be performed independently and in parallel so these computations can be spread among the eight half clusters as illustrated in FIG. 9 so that each half cluster processes approximately ⅛ of the rows, i.e., m/8 rows. In FIG. 9, the LMEM Mx blocks represent the local memories (e.g., LMEM 322 of FIG. 3) of the eight multiplying units M (e.g., sub-cluster M (338) of FIG. 3) and the LMEM Ax blocks represent the local memories (e.g., LMEM 330 of FIG. 3) of the eight arithmetic units A (e.g., sub-cluster A (346) of FIG. 3). The other blocks in FIG. 9 represent the arithmetic functions.

The row update computation, rowUpdate( ), requires storage of three types of data, the LLR estimates $L(q_j)$ from the previous iteration, the row value estimates $R_{mj}$ from the previous iteration, and intermediate column data. The LLR estimates (col1 in FIG. 9) and the row value estimates (row in FIG. 9) are stored in each of eight LMEM Mx and the intermediate column data (col2 in FIG. 9) is stored in each of the LMEM Ax. In addition, the results of the row update computation $R_{mj}'$ are stored in each of the eight LMEM Mx as the row value estimates $R_{mj}$ for the next iteration. All of the LLR estimates are stored in each LMEM Mx but only the row value estimates for the row updates to be performed on a particular half cluster x are stored in the corresponding LMEM Mx.

Figure 10:
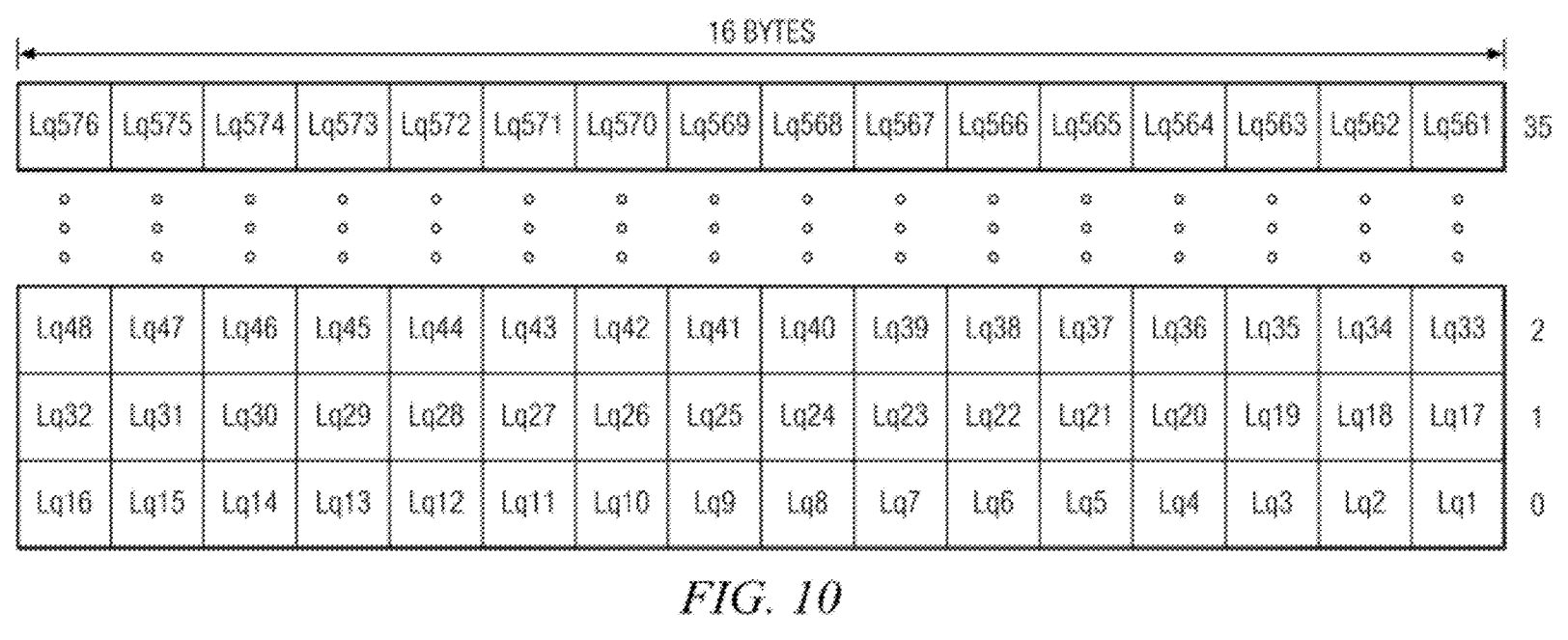

In one or more embodiments of the invention, each LMEM Mx stores the n=j LLR estimates $L(q_j)$ in ascending order with one $L(q_j)$ stored per byte. Ideally, to make maximum use of the 16 byte SIMD instructions, an $L(q_j)$ would be stored in each byte of a quadword. FIG. 10 illustrates the storage of the $L(q_j)$ in an LMEM Mx for n=576. In addition, space in each LMEM Mx is allocated to store m/8*rowmax row value estimates $R_{mj}$ where rowmax is the maximum number of ones allowed in a single row of the parity check matrix H. The value of rowmax may vary according to the code rate. Table 6 shows the value of rowmax for each code rate in IEEE 802.16e for the maximum allowable codeword length n=2304. Note that for any given row, there will be at most rowmax row value estimates.

Figure 11:
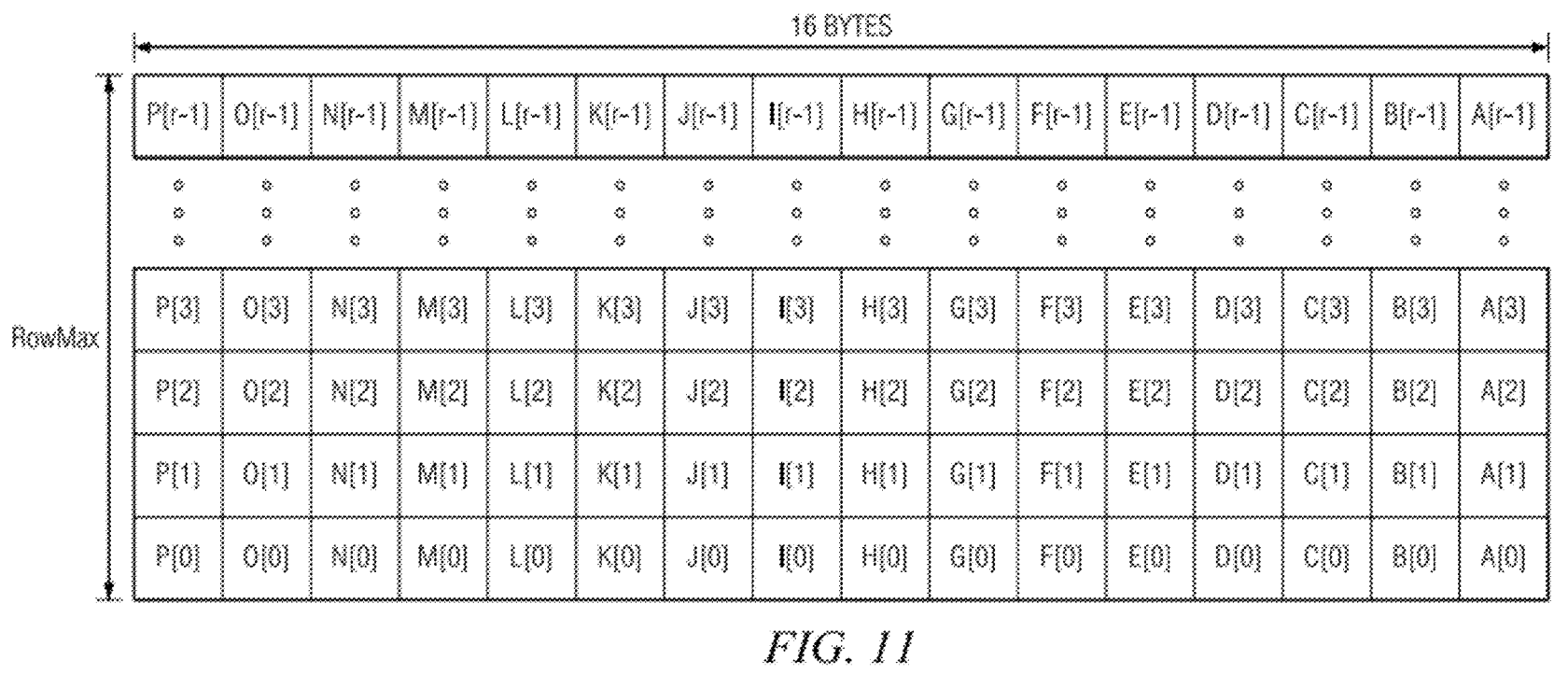

In one or more embodiments of the invention, space is allocated in each LMEM Mx for storage of the row value estimates $R_{mj}$ as illustrated in FIG. 11. Note that the rowmax row value estimates for each of the rows are stored in columns, i.e., the space for the rowmax row value estimates for a row labeled A is allocated in the first column, the space for the rowmax row value estimates for a row labeled B is allocated in the second column, etc., for sixteen rows. Here again, to make maximum use of the 16 byte SIMD instructions, ideally a row value estimate $R_{mj}$ would be stored in each byte of a quadword. This storage pattern is repeated for each group of 16 rows to be processed. Table 6 illustrates the number of row groupings per half cluster for the code rates defined in IEEE 802.16e for the maximum codeword length of n=2304. The fifth column shows the number of 16 row sets for the SIMD instructions and the sixth column shows how many of these 16 row sets would be allocated per half cluster. The last column lists the row update memory required per LMEM Mx for the row estimate data.

TABLE 6

| Code rate | Row Max | Number of rows (m) | RowMax * m | Number of row groups g per SIMD (m/16) | Number of groups per half cluster (g/8) | Number of bytes required per LMEM Mx |
|---|---|---|---|---|---|---|
| ½ | 7 | 1152 | 8064 | 72 | 9 | 1008 |
| ⅔ | 11 | 768 | 8448 | 48 | 6 | 1056 |
| ¾ | 15 | 576 | 8640 | 36 | 5 | 1200 |
| ⅚ | 20 | 384 | 7680 | 24 | 3 | 960 |

In one or more embodiments of the invention, each LMEM Ax stores n=j intermediate column data values (col2). The intermediate column data values are the accumulated updated row value estimates $R_{mj}'$ for each $L(q_j)$. More specifically, each intermediate column data value stored in an LMEM Ax is the sum of the updated row value estimates $R_{mj}'$ computed on a half cluster x that contribute to the calculation of the update of an LLR estimate $L(q_j)$. The intermediate column data values are stored in each LMEM Ax in ascending order, i.e., in the same order as the $L(q_j)$ in the LMEM Mx. Thus, the sum of the updated row value estimates $R_{mj}'$ computed on a half cluster x that contribute to the calculation of the update of an LLR estimate $L(q_j)$ during the column update computation is stored in a location in the LMEM Ax relative to the location of the corresponding $L(q_j)$ in the LMEM Mx. For example, if there is a one in row 12, column 15 of the parity check matrix H, then intermediate column data for $L(q_{15})$ calculated during the row 12 update would be stored in a location in an LMEM Ax in the same relative position as the location of $L(q_{15})$ in an LMEM Mx. The pseudo C code in Table 7 is an example of the accumulation of an intermediate column data value. Note that the storage space used for the actual intermediate column data values computed on one half cluster is approximately ⅛ of the space allocated. This space allocation is used to increase software efficiency during the column update computation. Other space allocations may be used to trade off software efficiency with memory usage.

TABLE 7

```
col2(i) = 0 (at start of iteration)
col2(i) = col2(i) + Rmj(1)
col2(i) = col2(i) + Rmj(2)
...
col2(i) = col2(i) + Rmj(n)
```

In the above memory allocation schemes, sixteen data values are stored per quadword in an attempt to make maximum use of the 16 byte SIMD instructions. Experiments have shown that this memory allocation scheme does not maximize throughput for all possible parity check matrices H. When multiple row updates are performed with one SIMD instruction, bank conflicts within a half cluster LMEM Mx can be caused due to the LLR estimates $L(q_j)$ that are associated with a specific row. To solve the problem of bank conflicts when accessing LLR estimates for multiple rows, the number of rows processed per SIMD instruction and the number of LLR estimates $L(q_j)$ stored in each quadword can be reduced to an optimal number.

In one or more embodiments of the invention, the optimal number of row value estimates $R_{mj}$ to be stored in each quadword (and processed per SIMD instruction) is determined based on the expansion factor z used to expand the base parity check matrix $H_b$ to define the parity check matrix H. More specifically, for most parity check matrices, the optimal number of row value estimates $R_{mj}$ per quadword is the largest integer factor≦16 (the number of bytes in the quadword) of the expansion factor z. For other parity check matrices, the optimal number of row value estimates $R_{mj}$ per quadword is determined empirically. The optimal number of LLR estimates $L(q_j)$ to be stored in each quadword for a given parity check matrix H, i.e., for a given expansion factor z, is determined empirically.

Figure 13:
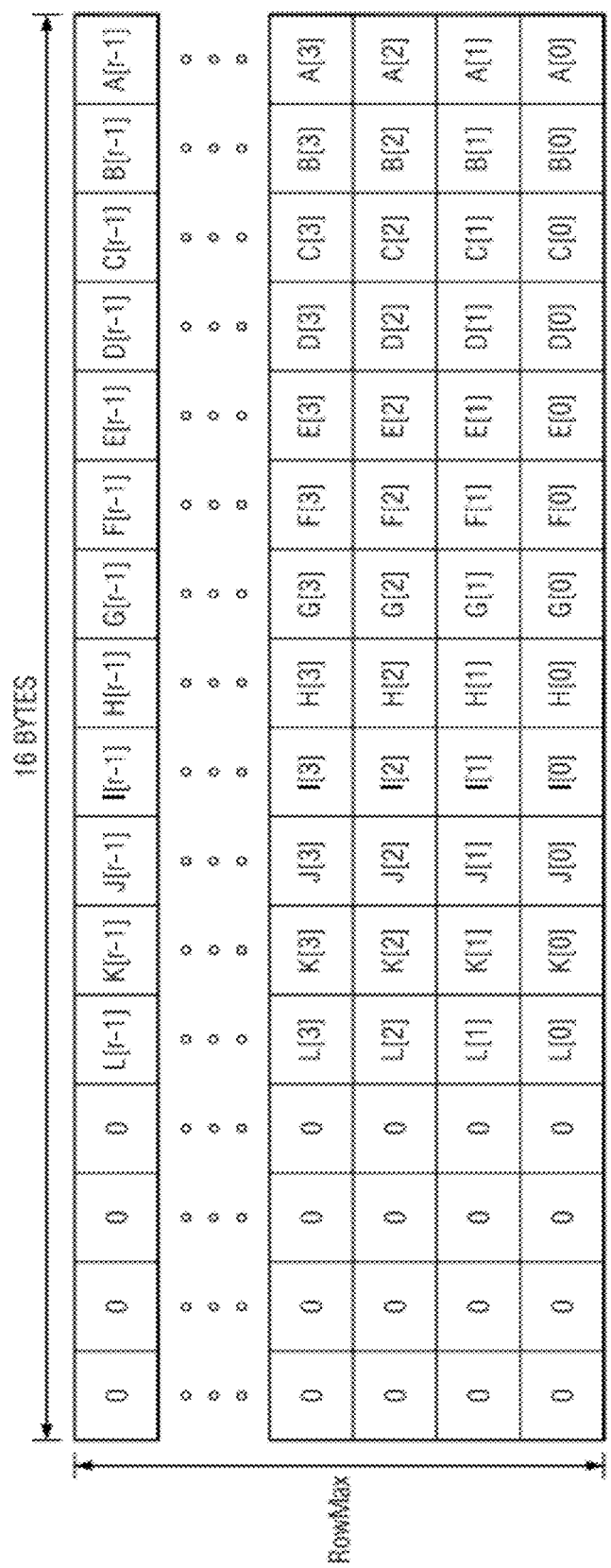

Table 8 shows the number of row value estimates $R_{mj}$ and LLR estimates $L(q_j)$ to be stored per quadword for each expansion factor z defined in IEEE 802.16. For z=68, 76, and 92, the number of rows to process was determined empirically. The number of LLR estimates $L(q_j)$ to store in each quadword was also determined empirically. Note that when these numbers are less than 16, the resolution of the bank conflicts comes at the cost of reduced data rate and/or increased memory requirements. For example, if z=24, then the number of row value estimates $R_{mj}$ to store in a quadword and the number of LLR estimates $L(q_j)$ to store in a quadword are both 12. FIGS. 12 and 13 illustrate the LMEM Mx storage allocation of LLR estimates and row value estimates, respectively, when z=24 and n=576. Note that the most significant bytes in each quadword have a value of zero, indicating no data is allocated in those bytes.

TABLE 8

| Z | # rows to process in LMEM ZR | # cols to store in each quadword in LMEM (ZC) |
|---|---|---|
| 24 | 12 | 12 |
| 28 | 14 | 14 |
| 32 | 16 | 16 |
| 36 | 12 | 12 |
| 40 | 10 | 15 |
| 44 | 11 | 16 |
| 48 | 16 | 16 |
| 52 | 13 | 13 |
| 56 | 14 | 14 |
| 60 | 15 | 15 |
| 64 | 16 | 16 |
| 68 | 12 (×5), 8 (×1) | 14 |
| 72 | 12 | 15 |
| 76 | 12 (×6), 4 (×1) | 16 |
| 80 | 16 | 16 |
| 84 | 14 | 14 |
| 88 | 11 | 15 |
| 92 | 12 (×7), 8 (×1) | 16 |
| 96 | 16 | 16 |

Referring again to FIG. 6, in one or more embodiments of the invention, computing a column update 604 involves computing Eq. (13) for each variable node j to update the LLR estimates $L(q_j)$ of the variable nodes:

$$L(q_j) = \sum_{m \in M(j)} R_{mj} - \frac{2r_j}{\sigma^2} \quad (13)$$

where M(j) is the set of all rows (checksum indices) for a given column j of checksum equations to which input bit j contributes to the checksum (i.e., all row indices for which the entries of the parity check matrix H in column j are 1). Eq. (13) effectively sums the row value estimates $R_{mj}$ over the jth column and adds in the estimated LLR of the original received input node value. The LLR estimate $L(q_j)$ for each variable node after the column update is computed (604) is a "soft value" of the correct bit value of the bit in the codeword corresponding to the variable node. More specifically, the value is an estimate of the LLR representing the probability that the value of the bit is a 0 or a 1.

In one or more embodiments of the invention, the computation of a column update as described above is performed on an LDPC coprocessor (e.g., the LDPC coprocessor of FIG. 3.) after the computation of the row update as described in relation to FIGS. 9-11 above. The computation is performed using SIMD instructions added for LDPC decoding such as those listed in Table 1. An example of the use of the SIMD instructions for computation of a column update is shown in section 1.2, entitled Column Update Pseudo Code, of the pseudo code listing incorporated by reference. This example assumes the memory layout described above.

Figures 14, 15:
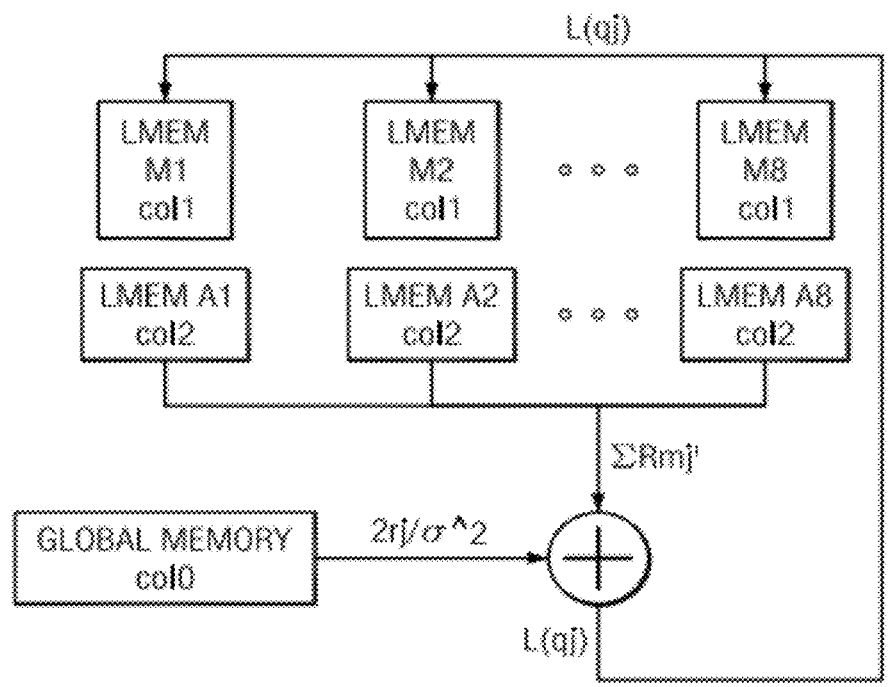
FIG. 14 shows a block diagram of a column update architecture using an LDPC coprocessor in accordance with one or more embodiments of the invention.
FIG. 15 shows a matrix multiplication in accordance with one or more embodiments of the invention.

The computation of the row update generates intermediate column data (col2) as previously described and stores the data in each of the LMEM Ax in each of the half clusters. As shown in FIG. 14, to compute the column update, the intermediate column data is summed with the original LDPC input data $2r_j/\sigma^2$ as described in Eq. (13) to generate the LLR estimates $L(q_j)$. In some embodiments of the invention, the original LDPC input data $2r_j/\sigma^2$ data is stored in global memory (e.g., global memory (left) 310 of FIG. 3). Once the intermediate column data and the original LDPC input data are summed, the resulting $L(q_j)$ are broadcast back to each of the LMEM Mx in each of the eight half clusters for use in the next row update computation.

Referring again to FIG. 6, after computation of a row update 602 and a column update 604, termination criteria are checked to see if any are met 606. If a termination criterion is met, decoding terminates 608. Otherwise, another iteration of computing a row update 602 and computing a column update 604 is executed. In one or more embodiments of the invention, the termination criteria may include checking for a maximum number of iterations and/or checking for decoding convergence, i.e., checking to determine if the codeword has been successfully decoded.

In general, in LDPC decoding, multiple iterations of row computations and column computations are needed to converge on a solution. The determination of whether an iteration has converged to an error free decoding, i.e., successfully decoded a codeword, is based on the per-column LLR estimates $L(q_j)$ computed by the column update 604. In some embodiments of the invention, a decoder termination method that computes Eqs. (14)-(16) is executed to check for convergence.

$I_j=0$ when $L(q_j) \geqq 0$ (14)

$I_j=1$ when $L(q_j)<0$ (15)

$H \times I = 0$ (16)

In the decoder termination method, an information matrix I of dimensions j×1 is computed based on the soft values $L(q_j)$, i.e., the estimated LLRs for each bit value, as per Eqs. (14) and (15). The elements in the information matrix I are "hard values", i.e., zeroes and ones, of the bit values corresponding to the variable nodes $L(q_j)$. The product of the information matrix I and the parity check matrix H is then computed as per Eq. (16). If the product is zero, the current iteration has converged on a solution, i.e., the information vector I is a valid codeword from which the transmitted information bits can be extracted.

In some embodiments of the invention, a decoder termination method using the $m_b \times n_b$ base parity check matrix $H_b$ (with an expansion factor z) rather than the parity check matrix H is executed to check for convergence. In general, this decoder termination method converts the information matrix I into a matrix of dimensions $n_b \times 1$ ($n_b = j/z$) in which each $n_b$ elements is a z×1 submatrix and performs matrix multiplication as shown in FIG. 15 to compute the product of I and $H_b$. As previously mentioned, each element of the base parity check matrix $H_b$ is a z×z submatrix. If the resulting product is zero, the current iteration has converged on a solution.

Note that the matrix multiplication in this decoder termination method is between binary matrices and recall that each of the non-zero submatrices in the base parity check matrix $H_b$ is an identity matrix that is circular shifted by some number. Therefore, the matrix multiplication between a submatrix h in $H_b$ and a submatrix i in I can be implemented as a single left (or up) rotation (circular shift) of the submatrix i by the rotation amount (circular shift amount) applied to the identity matrix to create the submatrix h. For example, as shown in FIG. 16, if the submatrix h is a 12×12 identity matrix that has been circular shifted by 2 and the submatrix i is a 12×1 matrix, the result of the matrix multiplication is a 12×1 matrix that is the equivalent to circular shifting the elements in i up (or left) by 2.

FIG. 17 is a flow graph of a method for decoder termination using the base parity check matrix $H_b$ in accordance with one or more embodiments of the invention. First, the soft values $L(q_j)$ are converted to j hard values 1700 in which a jth hard value is 0 when $L(q_j) \geqq 0$ and is 1 when $L(q_j)<0$. The j hard values are then grouped into $n_b$ z×1 submatrices in an $n_b \times 1$ information matrix I 1702. The product I' of the information matrix I and the base parity check matrix $H_b$ is then computed. The product I' is an $m_b \times 1$ matrix in which each of the $m_b$ elements is a z×1 submatrix. In one or more embodiments of the invention, each of the submatrices I'$(m_b,1)$ is computed as the dot product of the row $m_b$ of the base parity check matrix and the $n_b \times 1$ information matrix I. In addition, to compute the product of a submatrix $H_b(m_b,n_b)$ and a submatrix I$(n_b,1)$ for the dot product, the submatrix I$(n_b,1)$ is circular shifted by the circular shift amount used to circularly shift the z×z identity matrix to create the submatrix $H_b(m_b,n_b)$. If the submatrix $H_b(m_b,n_b)$ is a zero matrix or an identity matrix, the circular shift amount is 0. In one or more embodiments of the invention, the circular shift amount is determined by applying an algorithm defined in the communication standard that defines the base parity check matrix to the numeric value located at $H_b(m_b,n_b)$. The algorithm converts the numeric value to an integer between 1 and z−1 inclusive based on the code rate. As was explained in reference to FIG. 16, the result of the circular shift of the submatrix I$(n_b,1)$ is the same as performing a matrix multiply of $H_b(m_b,n_b)$ and I$(n_b,1)$.

If all of the elements of the product I' are zero submatrices (i.e., submatrices in which each element is zero) 1706, then the code word is decoded 1708. Otherwise, the codeword is not decoded 1710 and another iteration of computing a row update and a column update may be performed if other termination criteria have not been met. In one or more embodiments of the invention, to determine if all of the elements of the product I' are zero submatrices, first an XOR of all the elements of each submatrix I'($m_b$,1) is computed to generate each element of a vector of length $m_b$ in which the $m_b$th element is the result of the XOR of the elements of a submatrix I'($m_b$,1). Note that value of element of the vector will be a 0 or a 1, depending on the element of the corresponding submatrix I'($m_b$,1). Then, an OR of all of the elements of the vector is computed. If the result of the OR is 0, then the codeword is successfully decoded.

Figure 18:
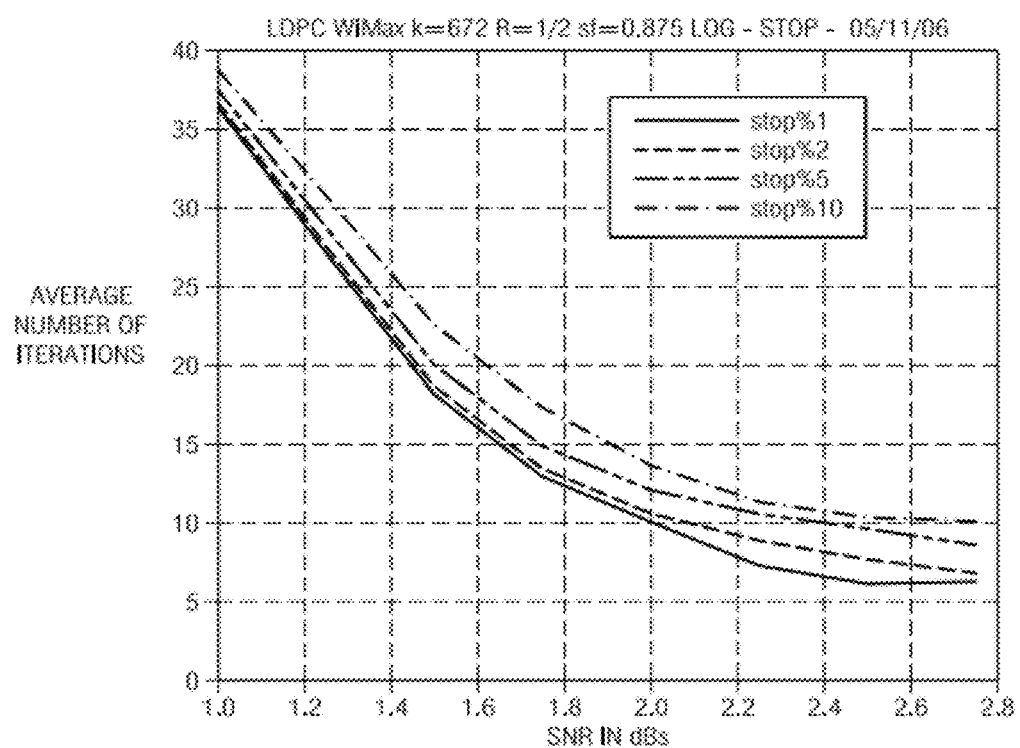
FIG. 18 shows a graph in accordance with one or more embodiments of the invention.

In one or more embodiments of the invention, a check for convergence (e.g., a decoder termination method) is executed in every iteration. In other embodiments of the invention, the check for convergence is performed once per x iterations where x is selected based on a tradeoff between of MIPS vs. an average number of iterations. FIG. 18 shows the average number of iterations when a check for convergence is executed once per iteration, once per two iterations, once per five iterations, and once per ten iterations. Simulations have shown that the frequency of checking for convergence has no effect on the bit error rate.

In one or more embodiments of the invention, the decoder termination method as described above is performed on an LDPC coprocessor (e.g., the LDPC coprocessor of FIG. 3.) after the computation of the row update and the column update as described above. The computation is performed using SIMD instructions added for LDPC decoding such as those listed in Tables 1 and 2. An example of the use of the SIMD instructions for decoder termination is shown in section 1.3, entitled Decoder Termination Pseudo Code, of the pseudo code listing incorporated by reference. This example assumes the memory layout described above.

In one or more embodiments of the invention, a method for decoder termination performed on an LDPC coprocessor using the base parity check matrix $H_b$ includes two parts: converting the soft estimates L($q_j$) into groups of size z of hard binary values, i.e., z×1 submatrices of an $n_b$×1 matrix $I_n$ and multiplying $H_b$ by $I_n$. If the result of the matrix multiplication is a matrix of $m_b$ zero value matrices, then there is convergence on a solution, i.e., the codeword is decoded. This matrix multiplication also includes two parts as is explained below in more detail.

In one or more embodiments of the invention, converting the soft estimates L($q_j$) into the $n_b$×1 matrix $I_n$ includes reading ZC L($q_j$) from any one of the M LMEMs (e.g., LMEM M1 of FIG. 9), slicing the ZC L($q_j$) into hard values as defined in Eqs. (14) and (15), combining the ZC hard values into blocks of z elements $\Delta_i$, and saving the blocks of z elements $\Delta_i$ in global memory (e.g., global memory (left) 310 of FIG. 3). Note that i=$n_b$ (i.e., the $\Delta_i$ are the submatrices of $I_n$) and ZC is defined in Table 8. The multiplication of $H_b$ by $I_n$ is then performed as illustrated by the pseudo C code shown in Tables 9 and 10, where Table 9 is pseudo C code for an outer loop and Table 10 is pseudo C code for an inner loop.

In the pseudo C code, Cmax=$n_b$, Rmax=$m_b$, and $I_r$ is an $m_b$×1 matrix in which each element is a z×1 submatrix. $I_r$ is initialized to zero. Further, Hb(r,$\Delta_i$) is a function that returns a rotation value r (i.e., a circular shift value) derived from the $H_b$ matrix for a $\Delta_i$. Each $\Delta_i$ is a submatrix $I_n$(i,1) of $I_n$. To multiply $H_b$ by $I_n$, the dot product of each row $m_b$ of $H_b$ with $I_n$ is formed. To form the dot product, the product of a submatrix $H_b$($m_b$,$n_b$) and a submatrix $I_n$($n_b$,1) is needed. As was previously explained, the product of $H_b$($m_b$,$n_b$) and $I_n$($n_b$,1) can be computed by rotating (circular shifting) $I_n$($n_b$,1) by the circular shift amount used to generate $H_b$($m_b$,$n_b$) from a z×z identity matrix. The function $H_b$(r,$\Delta_i$) returns this circular shift amount for a $\Delta_i$. In one or more embodiments of the invention, the function $H_b$(r,$\Delta_i$) implements an algorithm defined in the communication standard that defines the base parity check matrix $H_b$. The algorithm converts the numeric value located at $H_b$ ($m_b$, $n_b$) to an integer between 1 and z−1 inclusive based on the code rate.

TABLE 9

```
for (i=0; i<Cmax; i++) {
    Load Δ_i from global memory.
    Execute inner loop.
}
```

TABLE 10

```
For (r=0; r<Rmax; r++) {
    Get Hb(r,Δ_i).
    Δ_ri = Δ_i Rotate left by Hb(r,Δ_i).
    I_r = XOR(I_r, Δ_ri)
}
```

Once the matrix multiplication to generate $I_r$ is completed, the check for convergence is performed by first XORing the elements of each of the Rmax submatrices in $I_r$ together to form the Rmax elements of a vector $I_t$ where each element of $I_t$ is the result of XORing the elements of a corresponding submatrix in $I_r$. Then, an OR of all of the elements of $I_t$ is performed. If the result of the OR is 0, there is convergence on a solution, i.e., a codeword has been successfully decoded. Otherwise, another iteration of computing a row update and a column update may be performed.

Figure 19:
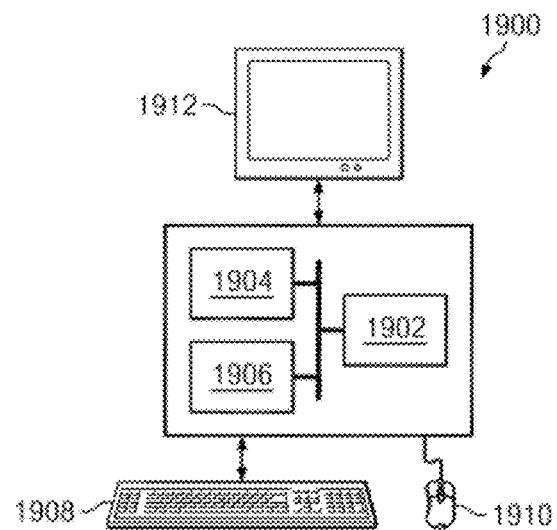
FIG. 19 shows a block diagram of a digital system in accordance with one or more embodiments of the invention.

Embodiments of the methods and systems for LDPC decoding described herein may be implemented for virtually any type of digital system (e.g., a desk top computer, a laptop computer, a set top box, a handheld device such as a mobile (i.e., cellular) phone, a personal digital assistant, etc.) that receives data over a communication channel. For example, as shown in FIG. 19, a digital system 1900 includes a processor 1902, associated memory 1904, a storage device 1906, and numerous other elements and functionalities typical of today's digital systems (not shown). In one or more embodiments of the invention, a digital system may include multiple processors and/or one or more of the processors may be digital signal processors (e.g., the digital signal processor of FIG. 2). The digital system 1900 may also include input means, such as a keyboard 1908 and a mouse 1910 (or other cursor control device), and output means, such as a monitor 1912 (or other display device). The digital system 1900 may be connected to a network 1914 (e.g., a local area network (LAN), a wide area network (WAN) such as the Internet, a cellular network, any other similar type of network and/or any combination thereof) via a network interface connection (not shown). Data streams encoded using an LDPC code may be received over the network and decoded using one or more of the methods for LDPC decoding described herein. Those skilled in the art will appreciate that these input and output means may take other forms.

Further, those skilled in the art will appreciate that one or more elements of the aforementioned digital system 1900 may be located at a remote location and connected to the other elements over a network. Further, embodiments of the invention may be implemented on a distributed system having a plurality of nodes, where each portion of the system and software instructions may be located on a different node within the distributed system. In one embodiment of the invention, the node may be a digital system. Alternatively, the node may be a processor with associated physical memory. The node may alternatively be a processor with shared memory and/or resources.

Software instructions to perform embodiments of the invention may be stored on a computer readable medium such as a compact disc (CD), a diskette, a tape, a file, or any other computer readable storage device. The software instructions may be distributed to the digital system (1900) via removable computer readable media such as a floppy disk, an optical disk, flash memory, a USB key, etc. In some embodiments of the invention, the software instructions may be distributed to the digital system via computer readable media such as electrical, optical, acoustical, or other forms of propagated signals (e.g., carrier waves, infrared signals, digital signals, etc.).

While the invention has been described with respect to a limited number of embodiments, those skilled in the art, having benefit of this disclosure, will appreciate that other embodiments can be devised which do not depart from the scope of the invention as disclosed herein. For example, the method of FIG. 8 may also be used to correct codewords in a received data stream encoded with an LDPC code using a variation of the belief propagation (BP) algorithm referred to as log-layer decoding. Log-layer decoding is also defined with Eqs. (5)-(8) and one additional equation that follows Eq. (8), $$L(q_j) = L(q_j) + R_j$$

This additional equation is processed after each $R_{mj}$ in Eq. (8) is calculated. The new value of $L(q_j)$ is used in Eq. (6) for the next row. Accordingly, the scope of the invention should be limited only by the attached claims.

It is therefore contemplated that the appended claims will cover any such modifications of the embodiments as fall within the true scope and spirit of the invention.

What is claimed is:

1. A digital system comprising:
   a digital signal processor; and
   a memory configured to store software instructions, wherein when executed by the processor, the software instructions cause the digital system to perform a method for decoding a codeword in a data stream encoded according to a low density parity check (LDPC) code having an m×j parity check matrix H, the method comprising:
      initializing each of j variable nodes in a graph representation of the parity check matrix H with a soft value $L(q_j)$ based on a jth symbol in the codeword, wherein the graph representation comprises m check nodes and j variable nodes and wherein a check node m provides a row value estimate $R_{mj}$ to a variable node j and a variable node j provides a column value estimate $L(q_{mj})$ to a check node m if H(m,j) contains a 1;
      computing row value estimates $R_{mj}$ for each check node m, wherein amplitudes of only a subset of column value estimates $L(q_{mj})$ provided to the check node m are computed;
      computing soft values $L(q_j)$ for each variable node j based on the computed row value estimates $R_{mj}$;
      determining whether the codeword is decoded based on the soft values $L(q_j)$; and
      terminating decoding when the codeword is decoded.

2. The digital system of claim 1, wherein the subset of the column value estimates $L(q_{mj})$ consists of two column value estimates $L(q_{mj})$.

3. The digital system of claim 1, wherein computing row value estimates $R_{mj}$ comprises:
   selecting a number λ of the column value estimates $L(q_{mj})$ provided to the check node m having smallest absolute values; and
   computing a row value estimate $R_{mj}$ for each variable node j providing a column value estimate $L(q_{mj})$ to the check node m by
      determining a sign of the row value estimate $R_{mj}$ based a sign of the column value estimate $L(q_{mj})$;
      when the variable node j provides one of a proper subset of the selected λ column value estimates $L(q_{mj})$, determining an amplitude of the row value estimate $R_{mj}$ based only on amplitudes of the other selected λ column value estimates $L(q_{mj})$, wherein the column value estimates $L(q_{mj})$ in the proper subset of the selected λ column value estimates $L(q_{mj})$ have the smallest absolute values of the selected λ column value estimates $L(q_{mj})$; and
      when the variable node j provides any of the other column value estimates $L(q_{mj})$, determining an amplitude of the row value estimate $R_{mj}$ based on amplitudes of all of the selected λ column value estimates $L(q_{mj})$.

4. The digital system of claim 1, further comprising:
   a memory configured to store a first plurality of single instruction multiple data (SIMD) addressable data words and a second plurality of SIMD addressable data words, wherein each data word consists of a number of bytes; and
   wherein the method further comprises:
      storing an optimal number of the row value estimates $R_{mj}$ for all check nodes m in each data word of the first plurality of SIMD addressable data words, wherein the optimal number is a largest integer factor of an expansion factor of the parity check matrix H, wherein the largest integer factor is less than or equal to the number of bytes, and
      storing an optimal number of the soft values $L(q_j)$ in each data word of the second plurality of SIMD addressable data words, wherein the optimal number of the soft values $L(q_j)$ is determined empirically for the parity check matrix H.

5. The digital system of claim 1, wherein the parity check matrix H is derived from $m_b \times n_b$ base parity check matrix $H_b$ using an expansion factor z, wherein $m_b = m/z$ and $n_b = j/z$, and wherein each element $H_b(m_b, n_b)$ is a z×1 submatrix, and wherein determining whether a codeword is decoded further comprises:
   converting the soft values $L(q_j)$ to hard values;
   grouping the hard values into an $n_b \times 1$ information matrix I wherein each element $I(n_b, 1)$ is a z×1 submatrix of hard values;
   computing the product of the base parity check matrix $H_b$ and the information matrix I, wherein the product is an $m_b \times 1$ matrix I' wherein each element $I'(m_b, 1)$ is a z×1 submatrix, wherein computing the product comprises for each row $m_b$ of the parity check matrix $H_b$, forming a dot product of the row $m_b$ and the information matrix I to generate a submatrix $I'(m_b, 1)$, wherein computing a product of a submatrix $I(n_b, 1)$ and a submatrix $H_b(m_b, n_b)$ is performed by circular shifting the submatrix $I(n_b, 1)$ by a circular shift value of the submatrix $H_b(m_b, n_b)$; and
   determining the codeword is decoded when all elements of all submatrices $I'(m_b, 1)$ are zero.

* * * * *